(12) United States Patent
Tsinker

(10) Patent No.: US 6,323,692 B1
(45) Date of Patent: Nov. 27, 2001

(54) TRANSCONDUCTANCE COMPENSATION CIRCUIT HAVING A PHASE DETECTOR CIRCUIT WITH CYCLE SLIPPING RECOVERY OPERATION AND METHOD

(75) Inventor: Vadim Tsinker, Belmont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/574,296

(22) Filed: May 19, 2000

(51) Int. Cl.[7] ................................................. G01R 25/00
(52) U.S. Cl. ................................................. 327/12; 327/7
(58) Field of Search .................. 327/2, 3, 7, 9, 327/12, 231, 233, 552, 553

(56) References Cited

U.S. PATENT DOCUMENTS

| | | | |
|---|---|---|---|
| 4,516,250 | * 5/1985 | Grimes | 375/328 |
| 4,902,920 | * 2/1990 | Wolaver | 327/12 |
| 5,192,884 | 3/1993 | Kusano | 327/552 |
| 5,200,716 | 4/1993 | Amano | 333/17.1 |
| 5,327,302 | * 7/1994 | Khoury et al. | 360/65 |
| 5,912,589 | 6/1999 | Khoury et al. | 330/261 |
| 5,963,084 | 10/1999 | Eschauzier | 327/553 |
| 6,107,870 | 8/2000 | Kawano | 327/553 |

* cited by examiner

Primary Examiner—Toan Tran
Assistant Examiner—Cassandra Cox
(74) Attorney, Agent, or Firm—Renner, Otto, Boisselle & Sklar, LLP

(57) ABSTRACT

A phase comparator for comparing the relative phase of a first input signal and a second input signal. The phase comparator detects a slipping condition, the slipping condition present if the first input signal leads the second input signal in phase and the first input signal is delayed for at least one cycle such that a first rising edge of the first input signal lags a first rising edge of the second input signal by greater than 180°. The phase detector resets at least one output of the phase comparator upon the detection of the slipping condition. Also described are circuits to implement the phase comparator and a transconductance compensation circuit for a filter, and methods of comparing phase and transconductance compensation.

56 Claims, 20 Drawing Sheets

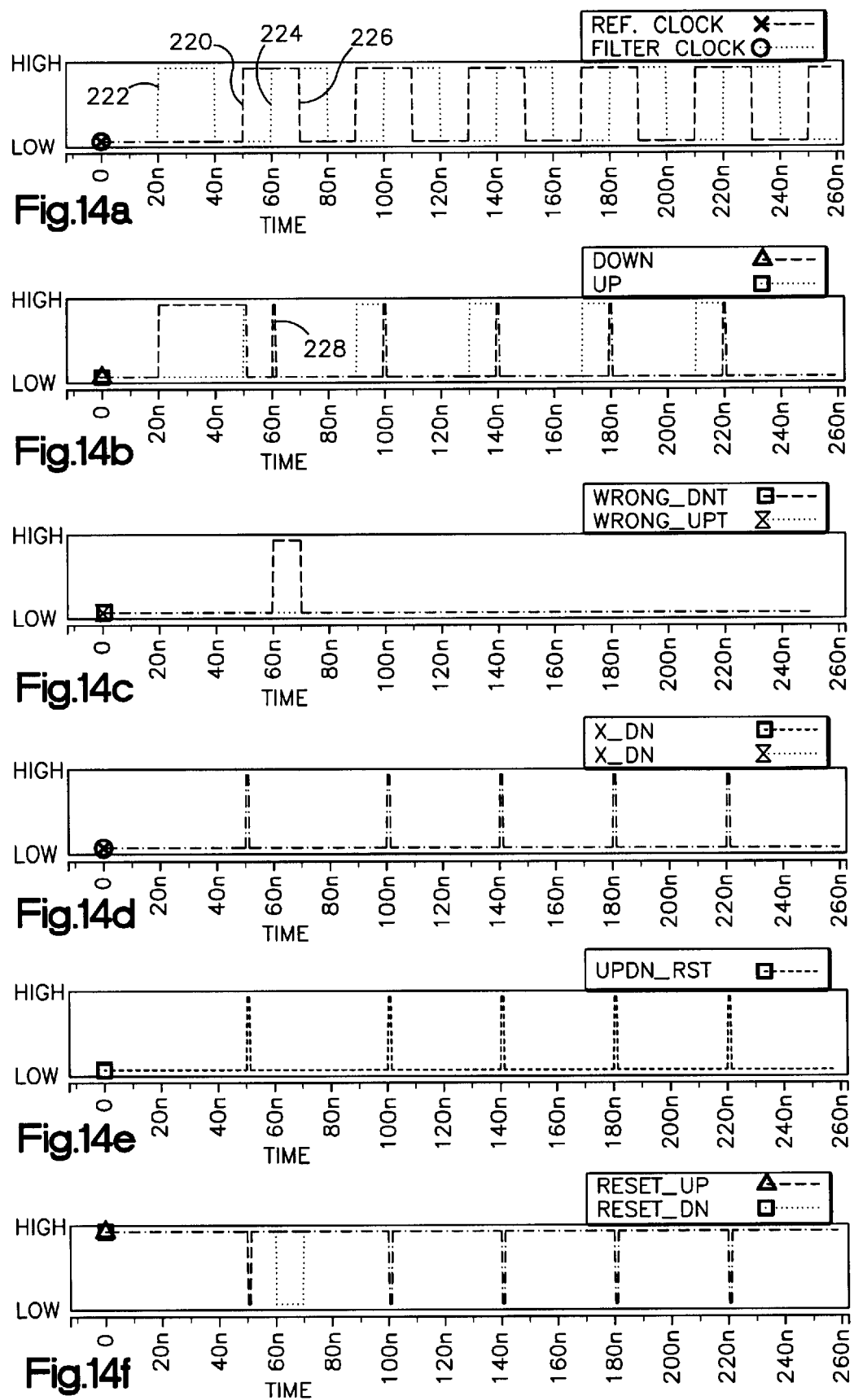

TRANSCONDUCTANCE COMPENSATION CIRCUIT HAVING A PHASE DETECTOR CIRCUIT WITH CYCLE SLIPPING RECOVERY OPERATION AND METHOD

TECHNICAL FIELD

The present invention generally relates to electrical signal filters and, more particularly, to a temperature and process compensation circuit for an electrical signal filter having an improved phase detector.

BACKGROUND ART

There is an ever present demand for analog data signal filters. Many signal filters, such as transconductance (Gm/C) filters, do not have stable gain-bandwidth products. The Gm/C of a signal filter varies with fluctuations in temperature and process characteristics. Process characteristics are physical and/or chemical properties resulting from the manufacturing process. If the Gm/C of the filter is allowed to fluctuate, the transfer characteristic of the filter will become erratic and may drift outside acceptable operating parameters.

Some techniques for adjusting the Gm/C of filters are known. However, in traditional correction circuits, establishing a proper comparison of the frequencies of a reference signal and a feedback signal is problematic. Some aspects of comparing the phase of two similar signals, such as the techniques used in phase lock loop (PLL) circuits, are sometimes useful in connection with the adjustment of Gm/C filters. PLL circuits, sometimes referred to as phase/frequency detectors (PFD), typically have a phase comparator to compare a reference clock signal with a feedback clock signal. As is known, the phase comparators output up and down pulses to regulate a charge pump. FIG. 16 illustrates a conventional phase comparator 300. The phase comparator has a first flip-flop 302 and a second flip-flop 304. Each of the flip-flops 302, 304 are rising clock edge triggered D-type flip-flops having their D inputs connected to logic high, or Vcc. Each of the flip-flops will reset upon receiving a logic low at a reset input, or R. Clock inputs of the flip-flops 302, 304 are respectively connected to the reference clock signal and the feedback clock signal. Up pulses will be generated at a Q output of the flip-flop 302 and down pulses will be generated at a Q output of the flip-flop 304. The up and down pulses are sent to respective inputs of the charge pump. The Q outputs of the flip-flops are also connected to a NAND gate 306. When up and down pulses are both received by the NAND gate, the output of the NAND gate, or reset signal RST, will go low thereby resetting the flip-flops 302, 304. It is noted that in the following examples, illustrated in FIGS. 17a–21e, the frequency of the reference and feedback signals is approximately 25 MHZ (i.e., a period of about 40 nanoseconds). Accordingly, the time (horizontal) axis of the figures is in nanoseconds and the vertical axis indicates whether the waveform is logical high (i.e., about 3 to 5 volts) or logical low (i.e., about zero volts).

Referring to FIGS. 17a–17e, the foregoing operation of the conventional phase comparator 300 is illustrated when the reference and feedback signals are in phase, or coincident. At the rising edges of reference clock signal (clkref in FIG. 17b) and the feedback clock signal (clkfb in FIG. 17a), the Q outputs of the flip-flops 302, 304 will each go high thereby generating up and down pulses as illustrated in FIGS. 17d and 17c respectively. Since both the up and down pulses are high, the reset signal RST (FIG. 17e) output from the NAND gate 306 will go low and reset the flip-flops 302, 304 causing the up and down pulses to go low.

FIGS. 18a–18e illustrate the operation of the conventional phase comparator 300 when the reference clock signal (clkref in FIG. 18b) leads the feedback clock signal (clkfb in FIG. 18a). At the rising edge of the reference clock signal, the Q output of the flip-flop 302 will go high thereby generating an up pulse as illustrated in FIG. 18d. The up pulse will remain high until the flip-flop 302 is reset. After a period of time determined by how much the feedback clock signal lags the reference clock signal (about 10 nanoseconds in the illustrated example), the rising edge of the feedback clock signal will cause the Q output of the flip-flop 304 to go high thereby generating a down pulse as illustrated in FIG. 18c. Shortly after the down pulse goes high, the reset signal RST (FIG. 18e) output from the NAND gate 306 will go low and reset the flip-flops 302, 304 causing the up and down pulses to go low. It is noted that in the situation illustrated by FIGS. 18a–18e, the up pulses of longer duration than the down pulses will cause the output of the charge pump to increase as is well known in the art. The output of the charge pump is usually connected to a circuit element(s) to slow the element(s) to bring the feedback clock signal in phase with the reference feedback signal.

FIGS. 19a–19e illustrate the operation of the conventional phase comparator 300 when the feedback clock signal (clkfb in FIG. 19a) leads the reference clock signal (clkref in FIG. 19b). As one skilled in the art will appreciate, this situation is analogous to the situation illustrated in FIGS. 18a–18e. More specifically, at the rising edge of the feedback clock signal, the Q output of the flip-flop 304 will go high thereby generating a down pulse as illustrated in FIG. 19c. The down pulse will remain high until the flip-flop 304 is reset. After a period of time determined by how much the reference clock signal lags the feedback clock signal, the rising edge of the reference clock signal will cause the Q output of the flip-flop 302 to go high thereby generating an up pulse as illustrated in FIG. 19d. Shortly after the up pulse goes high, the reset signal RST (FIG. 19e) output from the NAND gate 306 will go low and reset the flip-flops 302, 304 causing the up and down pulses to go low. It is noted that in the situation illustrated by FIGS. 19a–19e, the down pulses of longer duration than the up pulses will cause the output of the charge pump to decrease as is well known in the art. The output of the charge pump is usually connected to a circuit element(s) to speed up the element(s) to bring the feedback clock signal in phase with the reference feedback signal.

The operation of the conventional phase comparator 300 is adequate under the three situations illustrated in FIGS. 17a–17e, 18a–18e and 19a–19e. However, when either the reference or feedback clock signal is missing for one or more cycles, the conventional phase comparator 300 will not function properly for use with certain circuits that are not tolerant to phase slipping. A missing clock cycle can occur at any time, but most often occurs at start-up when a reference clock generator starts producing the reference clock signal but circuit components generating the feedback clock signal do not immediately generate the feedback clock signal, and vice versa.

FIGS. 20a–20e illustrate the operation of the conventional phase comparator 300 when the reference clock signal is ahead of (leads) the feedback clock signal (compare rising edge 310 with rising edge 311), but the reference clock signal is missing for a first cycle. Since the reference clock signal is ahead of the feedback clock signal, the proper response is to generate up pulses of longer duration than down pulses to increase the output of the charge pump and speed the feedback clock signal up to be in phase with the reference clock signal. However, as described in more detail below, the actual response of the conventional phase comparator 300 in this situation is to generate down pulses of very long duration compared to the up pulses. This will decrease the output of the charge pump and start to slow the feedback clock signal. This result may be acceptable in a circuit which can compensate for an adjustment in frequency where a phase slip of a compete cycle is acceptable to bring the feedback and reference signals in phase, such as in many PLL circuits. However, many circuits cannot tolerate such a phase slip. In addition, very long down pulses (i.e, over half a cycle) may saturate the charge pump.

At a first rising edge 308 of the feedback clock signal (FIG. 20a), the Q output of the flip-flop 304 will go high thereby generating a down pulse as illustrated in FIG. 20c. The down pulse will remain high until the flip-flop 304 is reset. After a period of time determined by how much a first rising edge 310 of the reference clock signal lags the first rising edge 308 of the feedback clock signal, the first rising edge 310 of the reference clock signal will cause the Q output of the flip-flop 302 to go high thereby generating an up pulse as illustrated in FIG. 20d. Shortly after the up pulse goes high, the reset signal RST (FIG. 20e) output from the NAND gate 306 will go low and reset the flip-flops 302, 304 causing the up and down pulses to go low. This operation will repeat for each cycle as illustrated in FIGS. 20a–20e and the conventional phase comparator circuit will continue to generate down pulses which are much longer in duration than the up pulses.

FIGS. 21a–21e illustrate the operation of the conventional phase comparator when the feedback clock signal is ahead of the reference clock signal (compare rising edge 314 with rising edge 315), but the feedback clock signal is missing for a first cycle. As one skilled in the art will appreciate, this situation is analogous to the situation illustrated in FIGS. 20a–20e. More specifically, at a first rising edge 312 of the reference clock signal, the Q output of the flip-flop 302 will go high thereby generating an up pulse as illustrated in FIG. 21d. The up pulse will remain high until the flip-flop 302 is reset. After a period of time determined by how much a first rising edge 314 of the feedback clock signal lags the first rising edge 312 of the reference clock signal, the first rising edge 314 of the feedback clock signal will cause the Q output of the flip-flop 304 to go high thereby generating a down pulse as illustrated in FIG. 21c. Shortly after the down pulse goes high, the reset signal RST (FIG. 21e) output from the NAND gate 306 will go low and reset the flip-flops 302, 304 causing the up and down pulses to go low. This operation will repeat for each cycle as illustrated in FIGS. 21a–21e and the conventional phase comparator circuit will continue to generate up pulses which are much longer in duration than the down pulses.

It is noted that the situation where the reference clock signal lags the feedback clock signal, but the reference clock signal is missing or delayed for one or more cycles, is not generally of concern since the conventional phase comparator 300 will begin to operate properly on its own (e.g., as illustrated in FIGS. 19a–19e). The same is true for the situation when the feedback clock signal lags the reference clock signal, but the feedback clock signal is missing or delayed for one or more cycles (e.g., FIGS. 18a–18e).

Therefore, there exists a need in the art for a phase comparator which compensates for the situation where one of the reference clock signal or the feedback clock signal is missing or delayed for one or more cycles. There also exists a need in the art for a phase comparator for use with components that are not tolerant of phase slipping, such as a transconductance delay filter. There also exists a need in the art for an improved transconductance compensation circuit.

SUMMARY OF THE INVENTION

According to one aspect of the invention, the invention is a phase comparator having a first latch connected to receive a reference signal, the reference signal having a first and a second logical state, and the first latch outputting a first control signal for a correction signal generator, the first control signal having a first and a second logical state; a second latch connected to receive a monitor signal, the monitor signal having a first and a second logical state, and the second latch outputting a second control signal for the correction signal generator, the second control signal having a first and a second logical state, the first and second control signals indicative of relative phase of the reference signal and the monitor signal; and a reset circuit for resetting the first and second latches when both of the following conditions are met: a) when one of the reference signal is in the first logical state or the first control signal is in the first logical state; and b) when one of the monitor signal is in the first logical state or the second control signal is in the first logical state.

According to another aspect of the invention, the invention is a phase comparator for comparing the relative phase of a first input signal and a second input signal, having a detecting means for detecting a slipping condition, the slipping condition present if the first input signal leads the second input signal in phase and the first input signal is delayed for at least one cycle such that a first rising edge of the first input signal lags a first rising edge of the second input signal by greater than 180°; and a resetting means for resetting at least one output of the phase comparator upon the detection of the slipping condition.

According to another aspect of the invention, the invention is a phase comparator having a first latch connected to receive a first input signal, the first input signal having a first and a second logical state, and the first latch outputting a first control signal for a correction signal generator, the first control signal having a first and a second logical state; a second latch connected to receive a second input signal, the second input signal having a first and a second logical state, and the second latch outputting a second control signal for the correction signal generator, the second control signal having a first and a second logical state, the first and second control signals indicative of relative phase of the reference signal and the monitor signal; and a reset circuit for resetting the second latch when both of the following conditions are met at a triggering edge of the second signal: a) the first input signal is in the first state; and b) the first control signal is in the first state.

According to another aspect of the invention, the invention is a transconductance compensation circuit for adjusting the transconductance of a data filter, having a signal generator for generating a reference signal; a proxy filter for delaying the reference signal to produce a filter signal; a phase comparator for comparing the relative phase of the reference signal and the filter signal, the phase comparator generating a first and second control signal indicative of the relative phase of the reference and filter signals, the phase comparator resetting at least one of the first or second control signals when at least one of the following conditions are met: a) the reference signal leads the filter signal in phase and the reference signal is delayed for at least one cycle such that a first rising edge of the reference signal lags a first rising edge of the filter signal by greater than 180°; or b) the filter signal leads the reference signal in phase and the filter signal is delayed for at least one cycle such that a first rising edge of the filter signal lags a first rising edge of the reference signal by greater than 180°; and a correction signal generator for generating a correction signal based on the relative phase of the reference and filter signals as indicated by the first and second control signals, wherein the correction signal is fed back to the proxy filter and the data filter to adjust the transconductance of the proxy filter and the data filter.

According to still another aspect of the invention, the invention is a method of comparing the phase of a reference signal, the reference signal having a first and a second logical state, and a monitor signal, the monitor signal having a first and a second logical state, having the steps of receiving the reference signal by a first latch and outputting a first control signal for a correction signal generator from the first latch, the first control signal having a first and a second logical state; receiving the monitor signal by a second latch and outputting a second control signal for the correction signal generator from the second latch, the second control signal having a first and a second logical state, the first and second control signals indicative of relative phase of the reference signal and the monitor signal; and resetting the first and second latches when both of the following conditions are met: a) when one of the reference signal is in the first logical state or the first control signal is in the first logical state; and b) when one of the monitor signal is in the first logical state or the second control signal is in the first logical state.

In accordance with another aspect of the invention, the invention is a method of comparing the relative phase of a first input signal and a second input signal, having the steps of generating a first control signal and a second control signal, the first and second control signals indicative of relative phase of the first and second input signals; detecting a slipping condition, the slipping condition present if the first input signal leads the second input signal in phase and the first input signal is delayed for at least one cycle such that a first rising edge of the first input signal lags a first rising edge of the second input signal by greater than 180°; and resetting at least one of the first or second control signals upon the detection of the slipping condition.

According to yet another aspect of the invention, the invention is a method of comparing the relative phase of a first input signal, the first input signal having a first and a second logical state, and a second input signal, the second input signal having a first and a second logical state, having the steps of: receiving the first input signal by a first latch and outputting a first control signal for a correction signal generator from the first latch, the first control signal having a first and a second logical state; receiving the second input signal by a second latch and outputting a second control signal for the correction signal generator from the second latch, the second control signal having a first and a second logical state, the first and second control signals indicative of relative phase of the reference signal and the monitor signal; and resetting the second latch when both of the following conditions are met at a triggering edge of the second signal: a) the first input signal is in the first state; and b) the first control signal is in the first state.

According to another aspect of the invention, the invention is a method of adjusting transconductance of a data filter, having the steps of generating a reference signal; delaying the reference signal with a proxy filter to produce a filter signal; comparing the relative phase of the reference signal and the filter signal; generating a first and second control signal indicative of the relative phase of the reference and filter signals; resetting at least one of the first or second control signals when at least one of the following conditions are met: a) the reference signal leads the filter signal in phase and the reference signal is delayed for at least one cycle such that a first rising edge of the reference signal lags a first rising edge of the filter signal by greater than 180°; or b) the filter signal leads the reference signal in phase and the filter signal is delayed for at least one cycle such that a first rising edge of the filter signal lags a first rising edge of the reference signal by greater than 180°; generating a correction signal based on the relative phase of the reference and filter signals as indicated by the first and second control signals; and feeding the correction signal back to the proxy filter and the data filter to adjust the transconductance of the proxy filter and the data filter.

BRIEF DESCRIPTION OF DRAWINGS

These and further features of the present invention will be apparent with reference to the following description and drawings, wherein:

FIGS. 14a–14f are timing diagrams illustrating a fourth example situation for the second embodiment of the phase comparator;

DISCLOSURE OF INVENTION

Introduction

Figure 1:
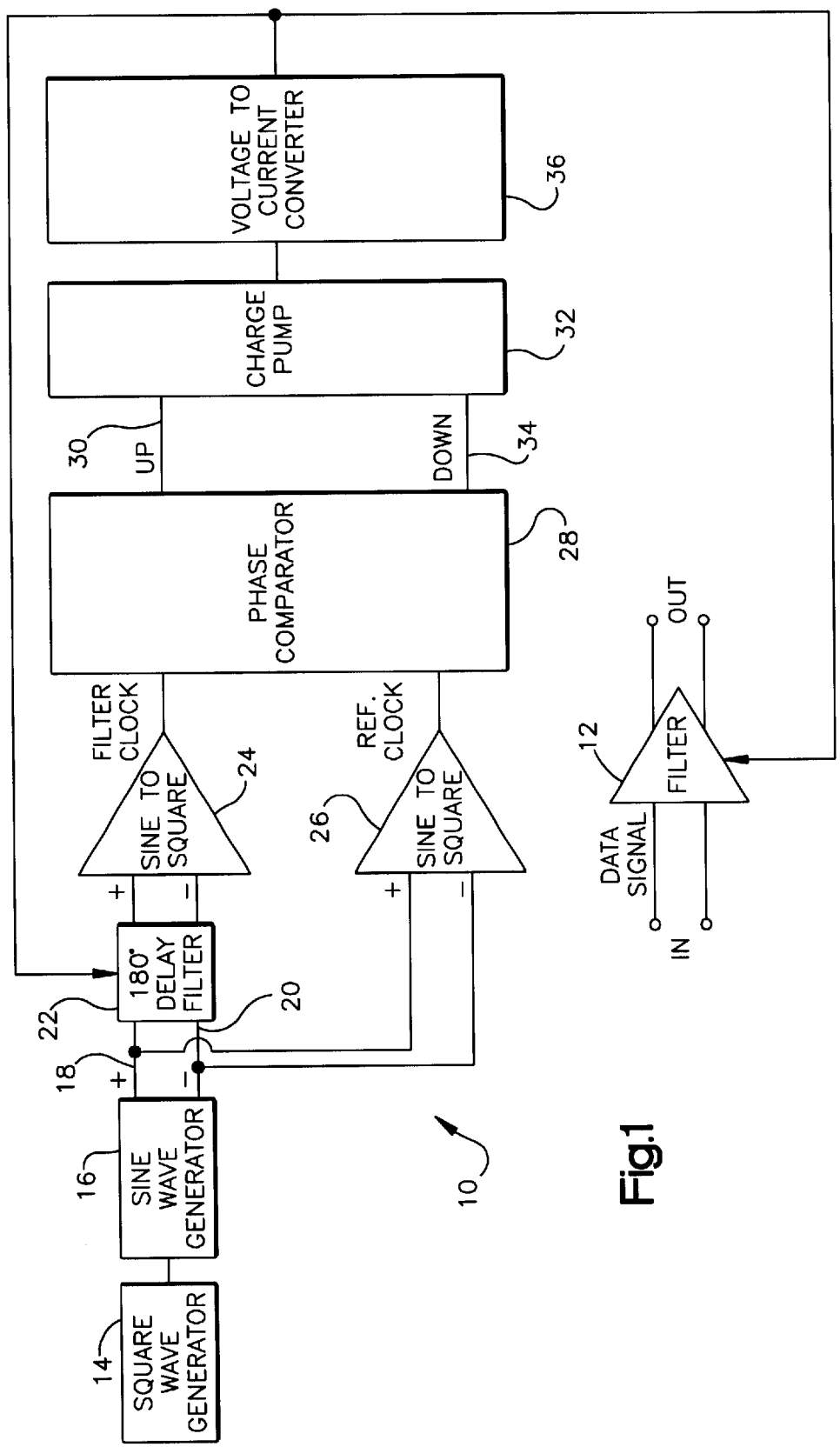
FIG. 1 is a block diagram of a transconductance compensation circuit according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Transconductance Compensation Circuit

Referring to FIG. 1, a block diagram of a transconductance compensation circuit 10 is illustrated. The transconductance compensation circuit 10 compensates for temperature and process variations (i.e., physical and/or chemical variations introduced during the manufacturing process) to maintain a desired transfer characteristic of a data signal filter 12. The data filter 12 can be used to condition an electrical signal such as a data signal received over an in-home data network operating over a conventional RJ11 telephone line. In general, the circuit 10 adjusts transconductance (Gm/C), or gain bandwidth product, of the data filter 12 based on monitoring a phase delay of a proxy filter having similar characteristics to the data filter 12. Therefore, no direct monitoring of the data filter 12 is made to minimize disruption of the performance of the data filter 12 otherwise caused by direct monitoring techniques.

The compensation circuit 10 has a clock generator, or square wave generator 14, for generating a square wave. The square wave is a rail-to-rail signal having a voltage amplitude referenced to ground or other voltage potential. As used herein, the term rail-to-rail square wave signal means a square wave that, when low, is set to a voltage supplied by a first power rail (e.g., ground) and, when high, is set to a voltage supplied by a second power rail (e.g., $V_{DD}$ or about 3 to 3.6 volts). The square wave has a selectable frequency. For example, the frequency of the square wave in one embodiment is about 1 MHZ to about 500 MHZ or higher, and in one embodiment about 15 MHZ to 16 MHZ. As discussed below in more detail, reference and filter clock signals are derived from the square wave and have about the same frequency as the square wave. In the example situations illustrated in FIGS. 5a–9e and 11a–15f, the frequency of the reference and filter clock signals is about 25 MHZ (i.e., a period of about 40 nanoseconds). Accordingly, the time (horizontal) axis of FIGS. 5a–9e and 11a–15f is in nanoseconds and the vertical axis indicates whether the waveform is logical high (about 3–5 volts) or logical low (about zero volts), unless otherwise indicated as being a voltage axis in millivolts.

The square wave is output from the square wave generator 14 and received by an input of a sine wave generator 16 coupled to an output of the square wave generator 14. The sine wave generator 16 converts the square wave into a sine wave. The sine wave is output from an output of the sine wave generator 16 and has characteristics to approximate characteristics of the data signal. For example, the sine wave is a differential (i.e., self-referenced) signal carried on a pair of conductors and the amplitude of the sine wave is limited to a few tenths of a volt (e.g., in one embodiment about 0.1 volts to 0.5 volts, and in one embodiment about 0.3 volts).

For a more detail discussion of the square wave generator 14 and the sine wave generator 16, attention is directed to U.S. patent application Ser. No. 09/545,485 filed Apr. 10, 2000, which is incorporated herein by reference in its entirety. Briefly, the sine wave generator 16 is a three stage device. The first stage is a clipper for clipping both the low and high portions of the square wave to a specified voltage and for converting the square wave to a differential signal. The second stage is an attenuator/filter which attenuates the signal to the desired output amplitude and performs some low pass filtering of the signal. The third stage is a low pass filter for shaping the waveform into a sine wave.

The output of the sine wave generator 16 is differential and connected to a pair of conductors. A first conductor of the pair of conductors, or positive conductor 18, is coupled to a positive output terminal of the differential output. A second conductor of the pair of conductors, or negative conductor 20, is coupled to a negative output terminal of the differential output. The conductors 18, 20 are connected to inputs of a 180° phase delay proxy filter 22.

The sine wave mimics the characteristics of the incoming data signal input to the data filter 12. Accordingly, the sine wave acts as a test, or reference, signal for monitoring the transconductance of the proxy filter 22.

The proxy filter 22 is constructed to be similar to the data filter 12. More specifically, the filters 12, 22 are preferably constructed adjacent one another on the same integrated circuit using the same fabrication techniques. Therefore, the transfer characteristic of the proxy filter 22 is susceptible to temperature variations and process variations similar to the transfer characteristic susceptibilities of the data filter 12. Any measurable changes to the transfer characteristics of the proxy filter 22 can be monitored as an indication of transfer characteristic changes of the data filter 12. Compensation can be applied to the proxy filter 22 to adjust the Gm/C of the proxy filter 22 to compensate for temperature and process variations thereby bringing the transfer characteristics within normal, acceptable tolerances. Since the susceptibilities of the proxy filter 22 and the data filter 12 are, or are assumed to be, very similar, the same compensation can be applied to data filter 12 to bring the transfer characteristics of the data filter 12 within normal, acceptable tolerances.

The proxy filter 22 has transfer characteristics that are similar or identical to the data filter 12. It is noted that the example data filter 12 is a low pass filter implemented with known transconductance filter designs. Therefore, the proxy filter is also a low pass filter and is used to introduce a phase shift, or delay. The proxy filter 22 can be implemented with known transconductance filter designs. Assuming the Gm/C of the proxy filter 22 is correctly adjusted, the proxy filter 22 introduces a 180° phase shift to the sine wave. The phase shift can be introduced in one or more stages. For example, the proxy filter 22 can have two stages, each shifting the sine wave by 90° for a total of 180° phase delay. One skilled in the art will appreciate that the data filter 12 and the proxy filter 22 can be configured as needed, such as a low pass filter, a high pass filter, notch filter, band pass filter or the like, as long as the proxy filter 22 delays the sine wave so that variations in Gm/C can be monitored and Gm/C changes in both filters 12, 22 with respect to temperature and process variations are designed to be substantially the same so as to provide a proper proxy operation of the correction circuit 10.

As will become more apparent below, the 180° phase shift introduced by the proxy filter 22 has at least two advantages over other delays, such as a single 90° phase shift. These advantages include ease of Gm/C correction since a small Gm/C error will result in a proportionately larger phase shift error which is more easily detectable. The 180° phase shift also allows for a comparison of the phase difference between the rising or falling edges of the signal output by the proxy filter 22 and a reference signal as discussed in more detail below.

The proxy filter 22 outputs a 180° phase delayed sine wave at a differential output of the proxy filter 22. The output of the proxy filter 22 is connected to an input of a first, or filter, sine to square wave converter 24. The filter sine to square wave converter 24 can be implemented with a known differential operational amplifier circuit having an inverting input and a noninverting input. The inverting and non-inverting inputs are respectively connected to the output of the proxy filter 22 so that the non-inverting input is effectively coupled to the positive output of the sine wave generator 16 via the proxy filter 22 and the positive conductor 18 and the inverting input is effectively coupled to the negative output of the sine wave generator 16 via the proxy filter 22 and the negative conductor 20. The filter sine to square wave converter 24 converts the delayed sine wave from the proxy filter 22 into a square wave, or filter clock signal, which is output from an output of the filter sine to square wave converter 24. The filter clock signal is not changed in phase (i.e., not inverted) by the filter sine to square wave converter 24. However, the filter sine to square wave converter 24 also amplifies the filter clock signal so that when the filter clock signal is high the filter clock signal has an amplitude of about 3 to 4 volts which can represent a logical high and when the filter clock signal is low the filter clock signal has an amplitude of about zero volts which can represent a logical low. It is noted that the amplification can take place in another stage, such as a separate amplifier or triggering circuit.

The conductors 18, 20 are also connected to an input of a second, or reference, sine to square wave converter 26 for converting the sine wave generated by the sine wave generator 16 into a square wave, or reference clock signal. The reference sine to square wave converter 26 can be implemented with a known differential operational amplifier circuit having a non-inverting and an inverting input. The positive conductor 18 is connected to the inverting input and the negative conductor 20 is connected to the non-inverting input. Therefore, the reference sine to square wave converter 26 also inverts the sine wave. The reference clock signal is output from the reference sine to square wave converter 26 at an output of the reference sine to square wave converter 26. However, the reference sine to square wave converter 26 also amplifies the reference clock signal so that when the reference clock signal is high the reference clock signal has an amplitude of about 3 to 4 volts which can represent a logical high and when the reference clock signal is low the reference clock signal has an amplitude of about zero volts which can represent a logical low. It is noted that the amplification can take place in another stage, such as a separate amplifier or triggering circuit.

Alternatively, the filter sine to square wave converter 24 can be configured to invert the delayed sine wave and the reference sine to square wave converter 26 can be configured to not change the phase (i.e., not invert) the sine wave. In another alternative embodiment, both or neither of the converters 24, 26 are configured to invert their respective signals and the proxy filter 22 is configured to invert the sine wave signal processed by the proxy filter 22. In any case, the rising edges of the reference and filter clock signals are output from their respective sine to square wave converters 24, 26 to be in phase, assuming the Gm/C of the proxy filter 22 is properly adjusted.

The outputs of the filter sine to square wave converter 24 and the reference sine to square wave inverter 26 are connected to inputs of a phase comparator 28. The phase comparator 28 will be addressed in greater detail below. Briefly, the phase comparator 28 compares the phase of the reference clock signal with the filter clock signal.

Figure 2:
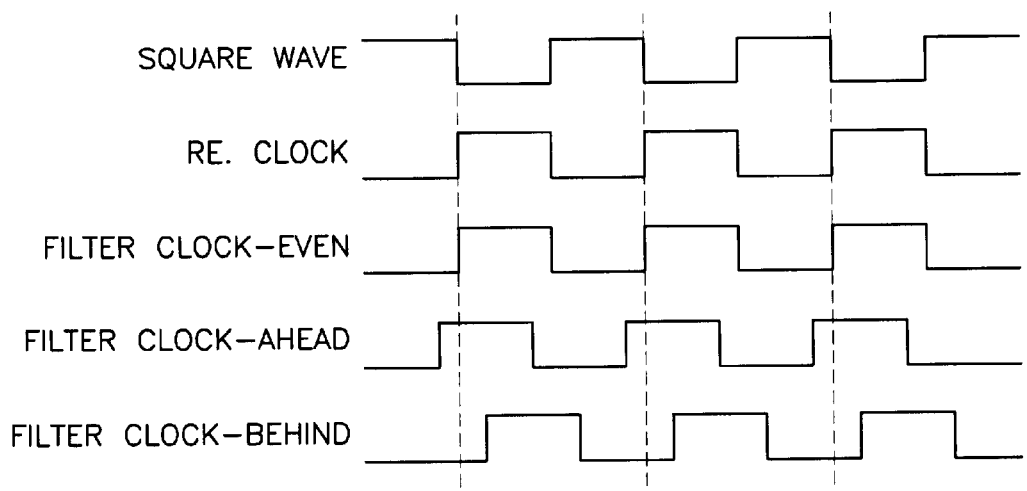
FIG. 2 is a timing diagram illustrating a portion of the operation of the transconductance compensation circuit.

Referring to FIG. 2, the general operation of the compensation circuit 10 will be explained in greater detail. FIG. 2 illustrates five waveforms. The top waveform in FIG. 2 represents the square wave output of the square wave generator 14. The square wave is subsequently converted to a sine wave by the sine wave generator 16 and converted back into a square wave by the reference sine to square wave converter 26 as the reference clock signal (the second wave form in FIG. 2). As illustrated in FIG. 2, the reference clock signal is an inverted representation of the original square wave and has substantially the same frequency as the square wave.

With continued reference to FIG. 2, three variations of the filter clock signal are represented. More specifically, the three filter clock signals represent when the filter clock signal is substantially in phase with the reference clock signal (i.e., even), when the filter clock signal leads (i.e., is ahead of) the reference clock signal, and when the filter clock signal lags (i.e., is behind) the reference clock signal. The phase comparator 28 detects the phase of the filter clock signal relative to the reference clock signal. When the phase of the reference and filter clock signals are substantially in phase, the Gm/C of the proxy filter 22 is adjusted within acceptable parameters. When the phase of the reference and filter clock signals are not in phase, the Gm/C of the proxy filter 22 is not adjusted within acceptable parameters.

As is similarly done in phase lock loop (PLL) circuits, the phase comparator will generate control signals for a correction signal generator. The correction signal generator has a charge pump and optionally a voltage to current converter. The control signals are "up" signal pulses carried on a first, or up, conductor 30, and "down" signal pulses carried on a second, or down, conductor 34. The up and down pulses are proportional to the phase difference, if any, between the reference and filter clock signals. Therefore, the up and down signal pulses are indicative of a phase relationship between the reference clock signal and the filter clock signal. The up conductor 30 and the down conductor 34 are connected to a charge pump 32. The charge pump 32 produces a variable voltage signal at an output of the charge pump 32. The output of the charge pump 32 is connected to an input of a voltage to current converter 36. The voltage to current converter circuit 36 converts the voltage present at the voltage output of the charge pump 32 to a current signal output at an output of the voltage to current converter 36. The output of the voltage to current converter is connected to Gm/C current correction inputs of both the data filter 12 and the proxy filter 22.

The number, duration and phase of the up and down signal pulses will be substantially equal when the filter and reference clock signals are substantially in phase. Under this condition, the charge pump 32 will output a substantially constant voltage, leading to a substantially constant current, or correction signal, being fed back from the voltage to current converter 36 to the filters 12, 22. It is noted that the if the Gm/C of the proxy filter 22 is determined to be acceptably adjusted, then the Gm/C of the data signal filter 12 is assumed to be also acceptably adjusted.

When the filter clock signal lags the reference clock signal, the Gm/C of the proxy filter 22 should be increased. It is noted that if the Gm/C of the proxy filter 22 is in need of adjustment, it is assumed that the data filter 12 is also in need of similar adjustment. When the foregoing phase difference is detected by the phase comparator 28, the phase comparator 28 will output more and/or longer up pulse signals than down pulse signals. The number and duration of up pulse signals can have a magnitude proportional to the phase difference between the reference and filter clock signals. The greater number and/or magnitude (i.e., duration) of up pulse signals than down pulse signals will cause the voltage output by the charge pump to increase, thereby causing the magnitude of the correction signal (i.e., current output from the voltage to current converter 36) to increase. The correction signal is used by the filters 12, 22 to respectively adjust the Gm/C of the filters 12, 22 as is well known in the art. As the Gm/C of the proxy filter 22 is adjusted to be within an acceptable tolerance, the phase of the filter clock signal will align with the phase of the reference clock signal and the operation of the correction circuit 10 will return to the operation described above for when the filter and reference clock signals are substantially in phase.

When the filter clock signal is ahead of the reference clock signal, the Gm/C of the proxy filter 22 should be decreased. When the foregoing phase difference is detected by the phase comparator 28, the phase comparator 28 will output more and/or longer down pulse signals than up pulse signals. The number and duration of down pulse signals can have a magnitude proportional to the phase difference between the reference and filter clock signals. The greater number and/or magnitude (i.e., duration) of down pulse signals than up pulse signals will cause the voltage output by the charge pump to decrease, thereby causing the magnitude of the correction signal (i.e., current output from the voltage to current converter 36) to decrease. The correction signal is used by the filters 12, 22 to respectively adjust the Gm/C of the filters 12, 22 as is well known in the art. As the Gm/C of the proxy filter 22 is adjusted to be within an acceptable tolerance, the phase of the filter clock signal will align with the phase of the reference clock signal and the operation of the correction circuit 10 will return to the operation described above for when the filter and reference clock signals are substantially in phase.

In summary, the current signal is a correction signal for adjusting the Gm/C of the proxy filter 22 and the data filter 12 based on the phase difference between the filter clock signal and the reference clock signal.

In an alternative arrangement, the proxy filter 22 can have transfer characteristic susceptibilities which are proportional, or are in a known relationship to, the transfer characteristic susceptibilities of the data filter 12, rather than being substantially the same. In this case, the correction signal can be modified (e.g., amplified or attenuated) before being feedback to one of the proxy filter 22 or the data filter 12. Alternatively, the voltage to current converter circuit 36 can have two outputs which respectively provide a proxy filter correction signal and a data filter correction signal.

Example Use of Transconductance Compensation Circuit

Figure 3:
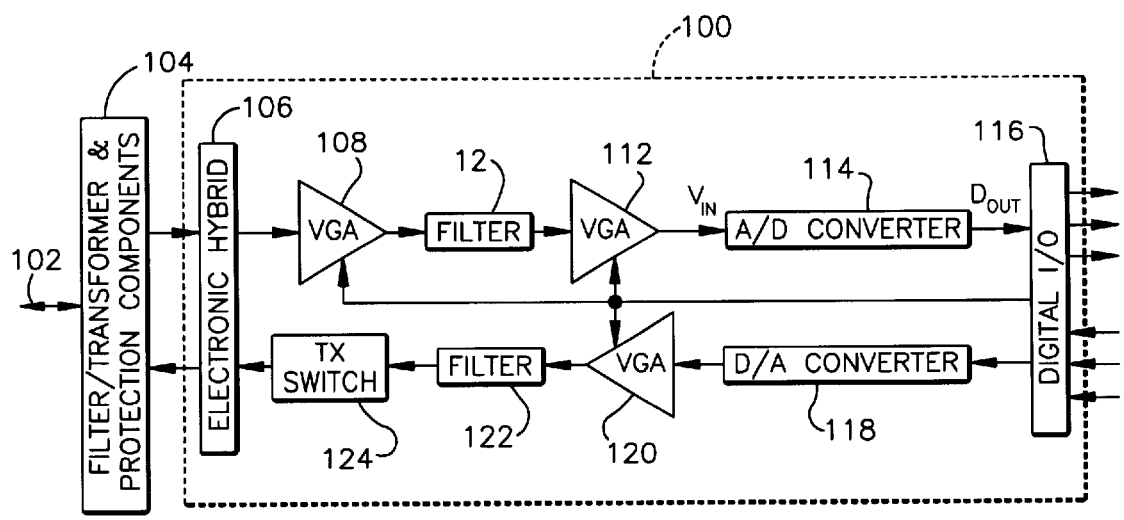
FIG. 3 is a block diagram of an analog front end circuit having a filter which is adjusted by the transconductance compensation circuit.

The correction circuit 10 of the present invention is well suited for use in a variety of applications where data signal filters are used. As an example, FIG. 3 illustrates a block diagram showing an analog front end circuit 100, or physical layer, of a networking device, such as a 10 Mbps or higher bandwidth in-home data network operating over a conventional RJ11 telephone line 102, or plain old telephone system (POTS). The analog front end circuit receives data signals from the telephone line 102 via circuit 104 having components to condition the data signal, such as filters, transformers and surge protection. The received signals are processed by an electronic hybrid circuit 106 to perform functions such as collision detection. Next, the received signals are passed first through a variable gain amplifier (VGA) 108, the data filter 12 being adjusted by the transconductance compensation circuit 10 of the present invention (not shown in FIG. 3), and a second VGA 112 to further condition the received signals. The data filter 12, is, for example, a transconductance (Gm/C) low pass filter for filtering out high frequency components of the data signal.

The conditioned received signal is input into an analog to digital (A/D) converter 114. The A/D converter 114 converts the analog data input signals into a digital output which is then sent from the A/D converter 114 to a digital input/output (I/O) circuit 116. The digital I/O circuit 116 acts as an interface between the analog front end circuit 100 and a subsequent network device circuit, such as a circuit to implement the data link layer of an open systems interconnection (OSI) protocol stack.

Digital data output signals received from the subsequent network device circuit by the analog front end circuit 100 are received by the digital I/O circuit 116. The digital data output signals are converted to a transmit analog signal by a digital to analog (D/A) converter 118. The transmit analog signal is conditioned by a third VGA 120. The third VGA 120 acts as an adjustable gain transmit attenuator to allow for flexibility in setting the transmit power of the analog front end circuit 100. The attenuated transmit signal is further conditioned by a filter 122. Like the data filter 12, the filter 122 can also be a transconductance (Gm/C) filter which is adjusted by a transconductance compensation circuit, such as the transconductance compensation circuit 10 as described herein. The filtered, attenuated transmit signal is optionally passed through a transmit switch 124 before being sent to the telephone line 102 through the electronic hybrid circuit 106 and the circuit 104.

The analog front end circuit 100, including the filter 12 and compensation circuit 10, can be implemented as part of an integrated circuit, made using known integrated circuit manufacturing technology in a medium such as 0.35 $\mu$m CMOS.

Phase Comparator Embodiments

First Embodiment

Figure 16:
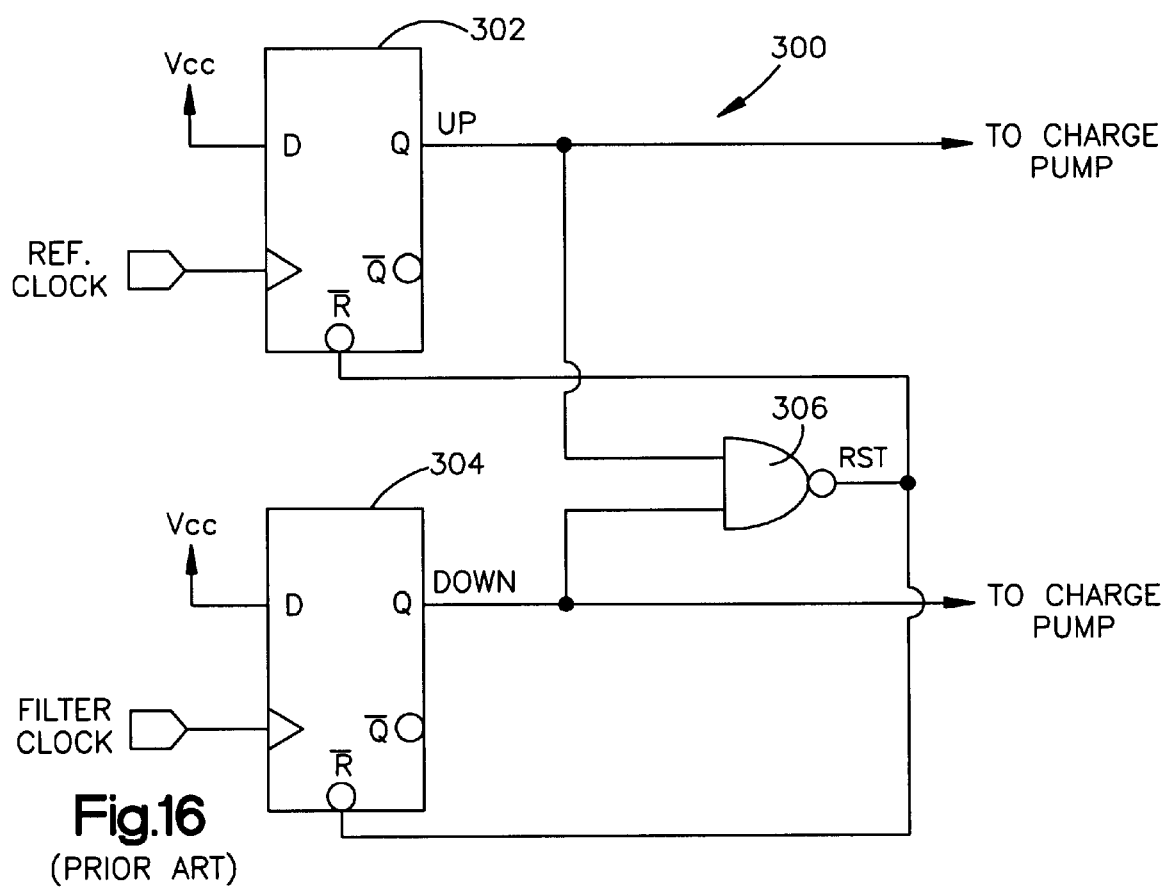
FIG. 16 is a schematic of a conventional phase comparator.
Figure 20A:
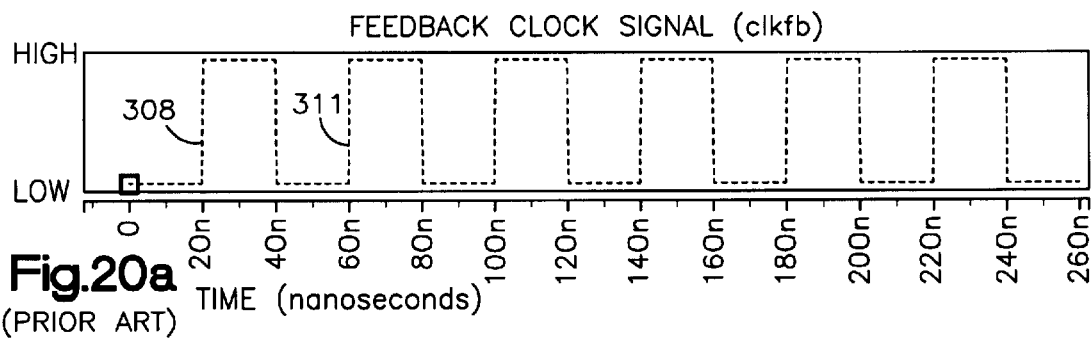
FIGS. 20a–20e are timing diagrams illustrating a fourth example situation for the conventional phase comparator.
Figure 20B:
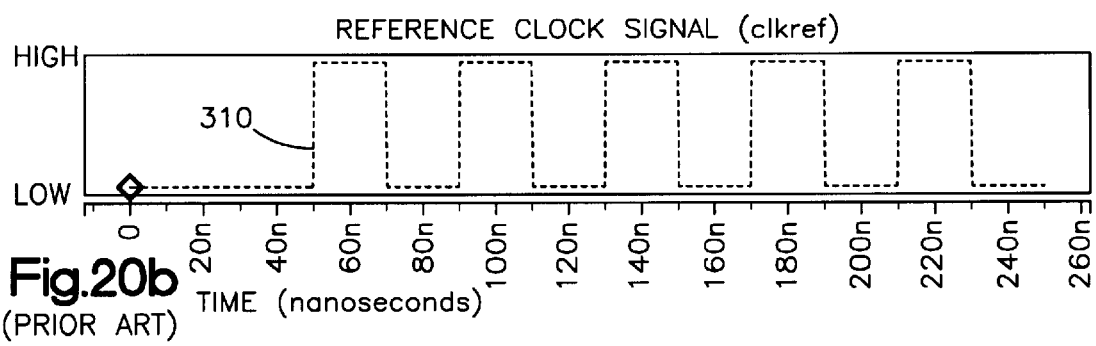
Figure 20C:
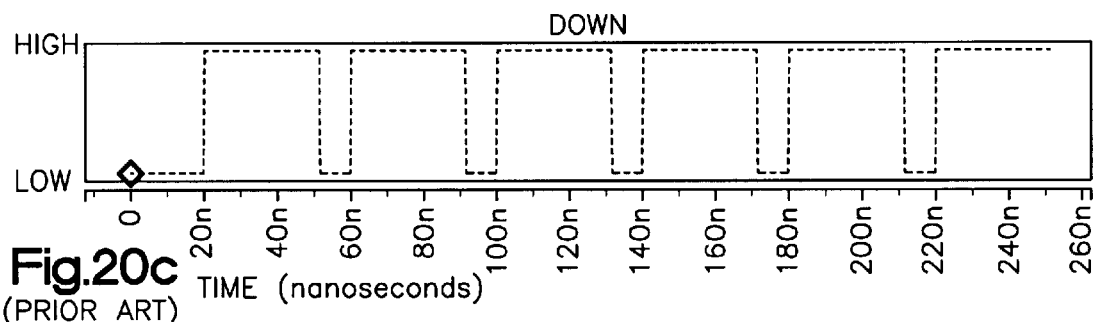
Figure 20D:
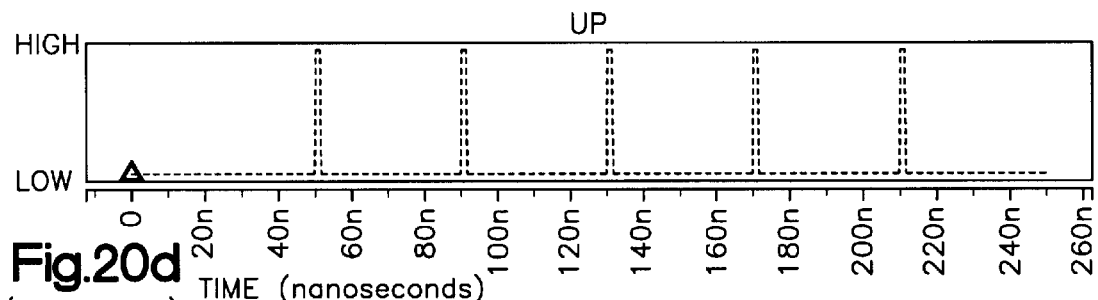
Figure 20E:
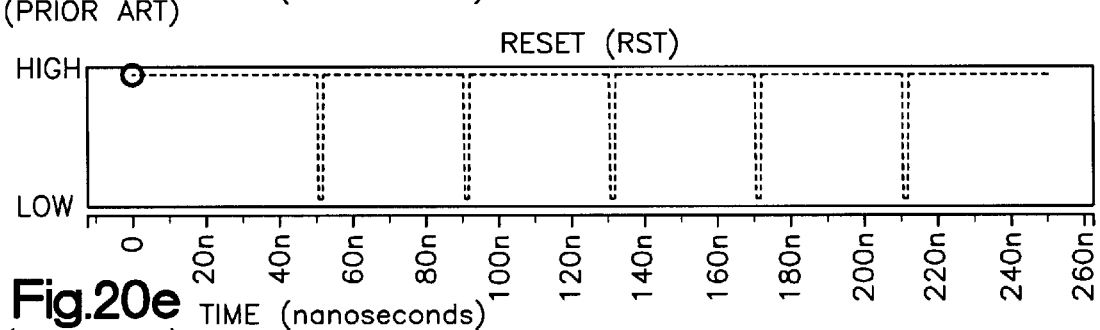
Figure 21A:
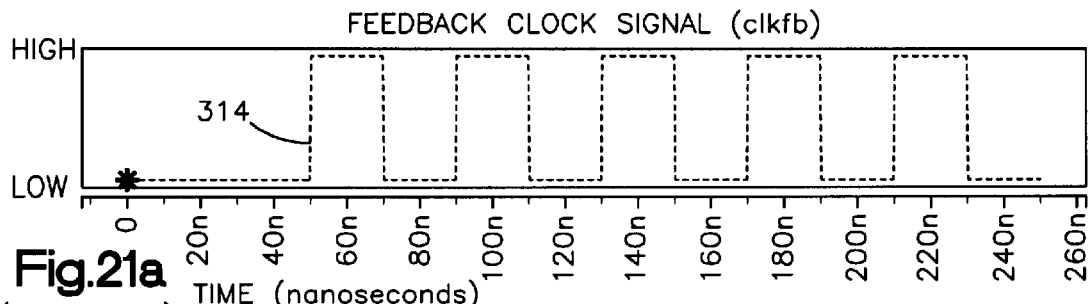
FIGS. 21a–21e are timing diagrams illustrating a fifth example situation for the conventional phase comparator.
Figure 21B:
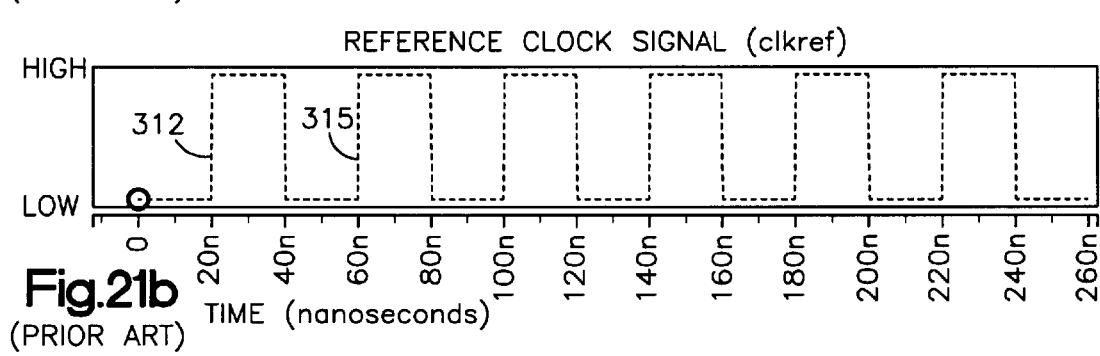
Figure 21C:
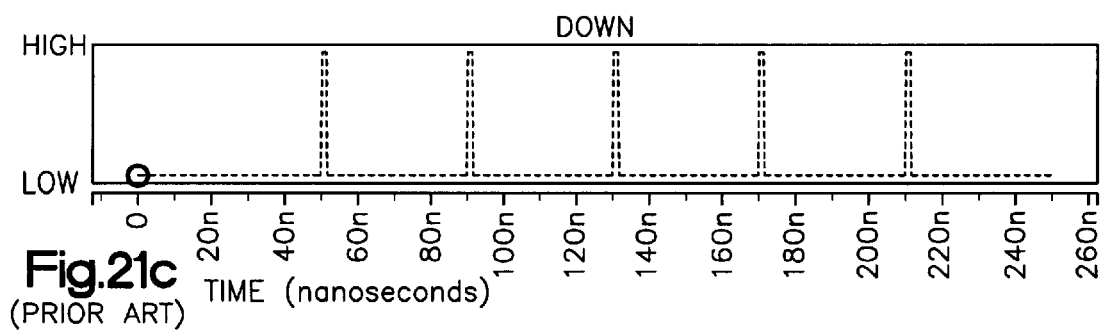
Figure 21D:
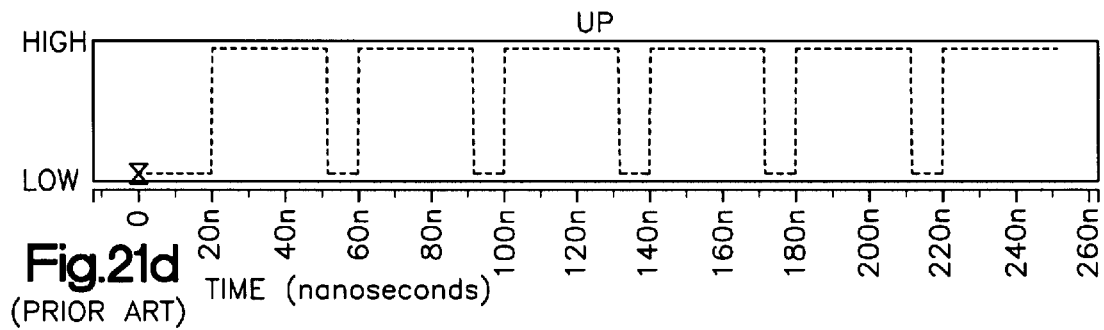
Figure 21E:
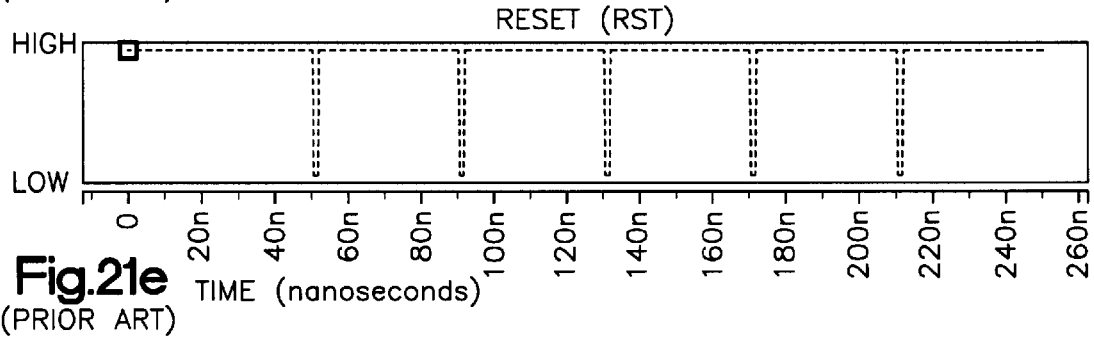

As an initial observation, it is noted that the proxy filter 22 is not tolerant of being corrected by the correction signal to slip one or more cycles to adjust the filter clock signal to be in phase with the reference clock signal. More specifically, the proxy filter 22 is a 180° delay filter which would no longer function as a 180° delay filter if the transconductance of the proxy filter 22 is adjusted in either direction by more than 180°. This also means that under normal operating conditions the filter clock signal should not be more than 180° out of phase with the reference clock signal. In the event that one of the filter clock signal or the reference clock signal is missing or delayed for one or more cycles, the conventional phase comparator 300 described in conjunction with FIG. 16 will not work appropriately with the transconductance compensation circuit 10 of the present invention. In short, the conventional phase comparator 300 will compare rising edge 308 (FIG. 20a) with rising edge 310 (FIG. 20b) when it should be comparing rising edge 310 with rising edge 311 (FIG. 20a). In an analogous situation, the conventional phase comparator 300 will compare rising edge 312 (FIG. 21b) with rising edge 314 (FIG. 21a) when it should be comparing rising edge 314 with rising edge 315 (FIG. 21b).

Figure 4:
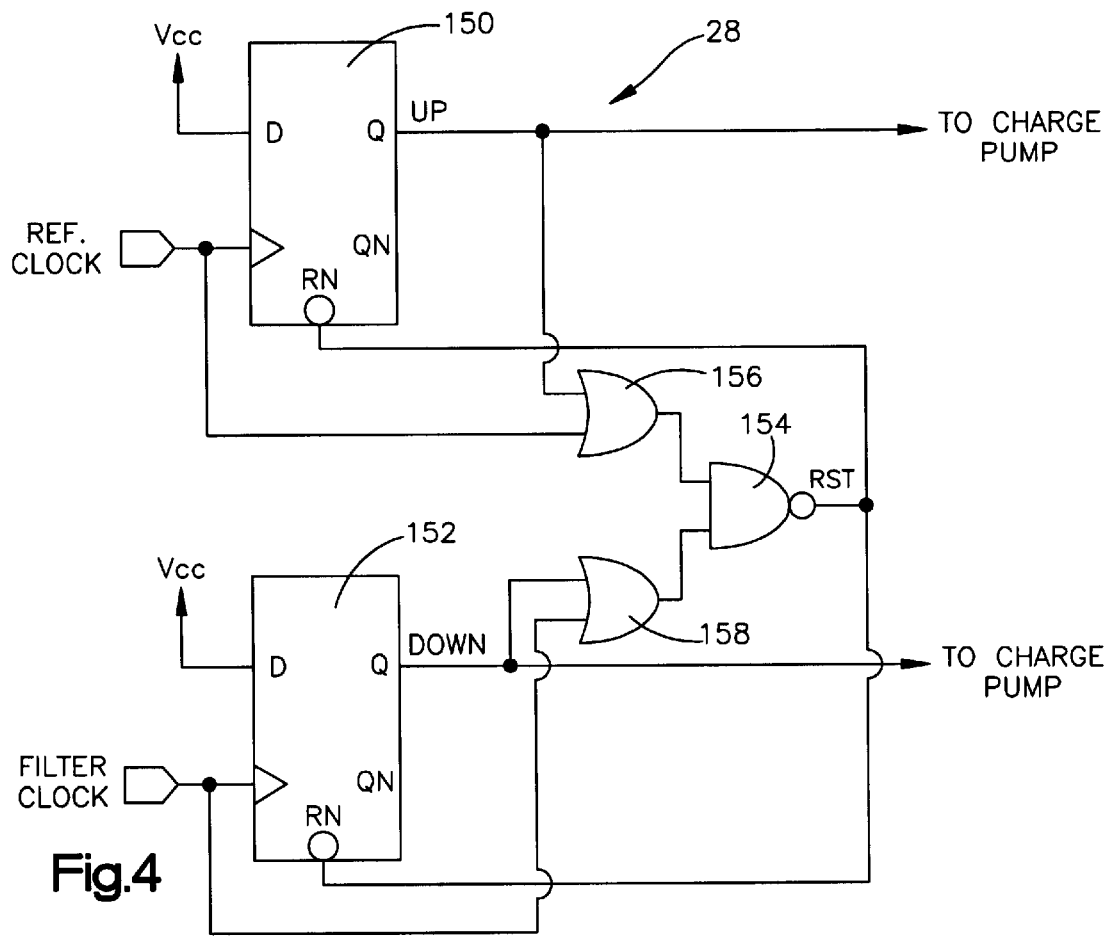
FIG. 4 is a schematic of a phase comparator according to a first embodiment.

Turning to FIG. 4, a first embodiment of the phase comparator 28 is illustrated. The phase comparator 28 has a first flip-flop 150 and a second flip-flop 152. Each of the flip-flops 150, 152 are rising clock edge triggered D-type flip-flops having their D inputs connected to logic high, or Vcc. Each of the flip-flops 150, 152 will reset upon receiving a logic low at a reset input, or RN. One skilled in the art will appreciate that other types of latches or circuit components may be used in place of D-type flip-flops.

Clock inputs of the flip-flops 150, 152 are respectively connected to the reference clock signal and the filter clock signal. Up pulses will be generated at a Q output of the first flip-flop 150 and down pulses will be generated at a Q output of the second flip-flop 152. The up and down pulses are sent to respective inputs of the charge pump 32. However, if the charge pump 32 is expecting inverted up and down pulses, the inverting outputs of the flip-flops 105, 152, can be connected to the charge pump 32.

A reset signal RST is produced by a NAND gate 154. If the inputs to the NAND gate 154 are set to logic high, the output of the NAND gate 154, or the reset signal RST, will go low thereby resetting the flip-flops 150, 152. The inputs of the NAND gate 154 are respectfully connected to the outputs of a first OR gate 156 and a second OR gate 158. The first OR gate 156 has inputs respectively connected to receive the reference clock signal and the up pulses generated at the Q output of the first flip-flop 150. The second OR gate 158 has inputs respectively connected to receive the filter clock signal and the down pulses generated at the Q output of the second flip-flop 152.

Figure 5A:
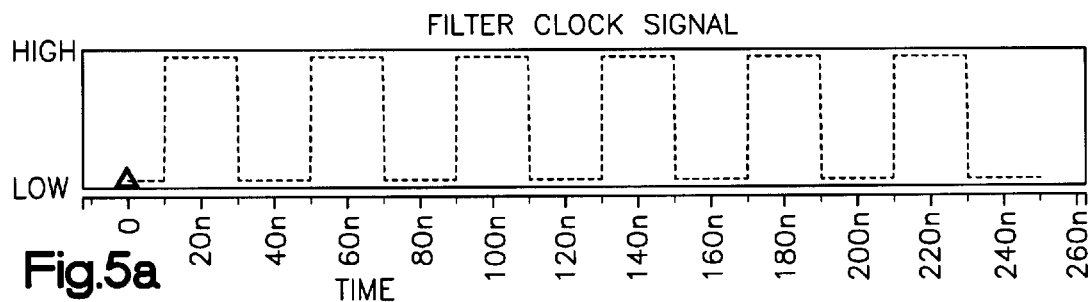
FIGS. 5a–5e are timing diagrams illustrating a first example situation for the first embodiment of the phase comparator.
Figure 5B:
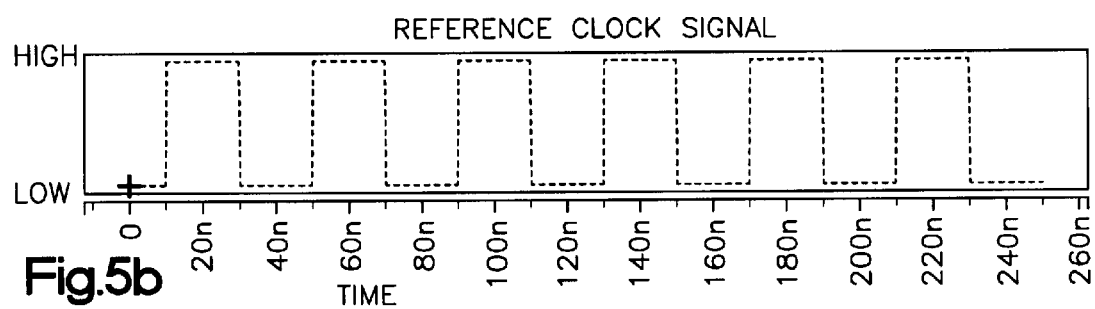
Figure 5C:
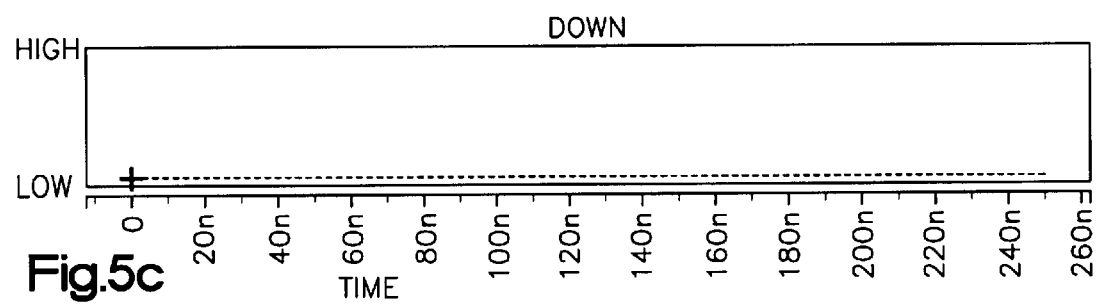
Figure 5D:
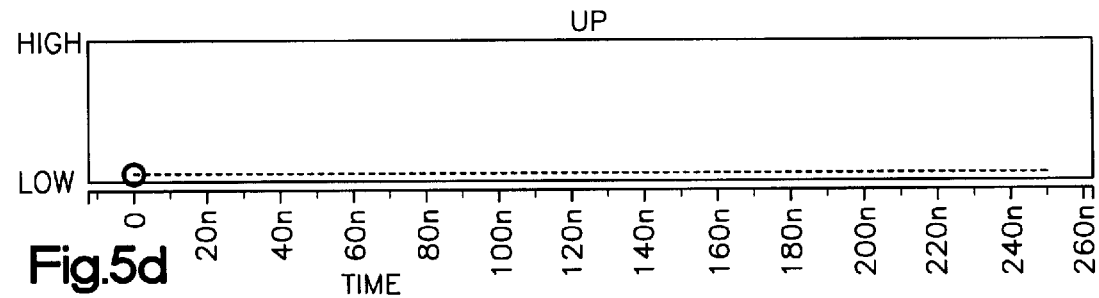
Figure 5E:
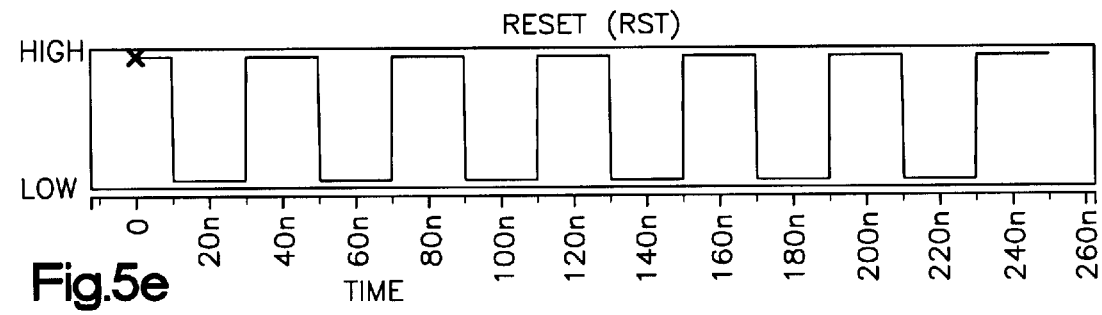

With additional reference to FIGS. 5a–5e, the operation of the phase comparator 28 of the first embodiment when the reference and filter clock signals (FIGS. 5b and 5a respectively) are in phase, or coincident, is illustrated. As the reference clock signal transitions from low to high, the output of the First OR gate 156 will go high. As the filter clock signal transitions from low to high, the output of the second OR gate 158 will go high. Therefore, both inputs of the NAND gate 154 will be high which causes the NAND gate 154 to transition the reset signal RST (FIG. 5e) to logical low thereby resetting the flip-flops 150, 152. It is noted that in the illustrated first embodiment of the phase comparator 28, the flip-flops 150, 152 may be reset so quickly that, in this situation, no up and down pulses will be generated (FIGS. 5d and 5c respectively). However, depending on the propagation delay of the OR gates 156, 158 and the NAND gate 154, the flip-flops 150 and 152 may respectively begin to generate up and down pulses, but these pulses will generally not exceed a voltage to be considered logical high (e.g., a peak of about one volt or less).

Figure 6A:
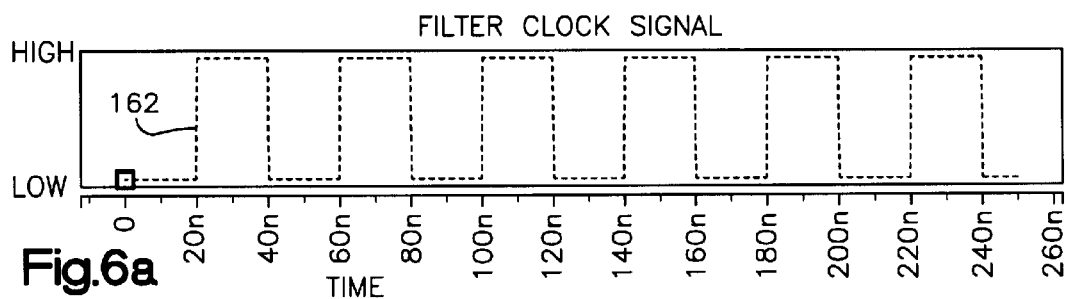
FIGS. 6a–6e are timing diagrams illustrating a second example situation for the first embodiment of the phase comparator.
Figure 6B:
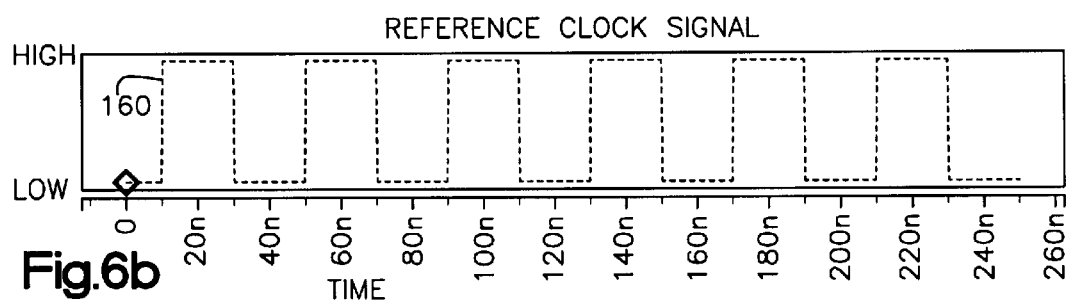
Figure 6C:
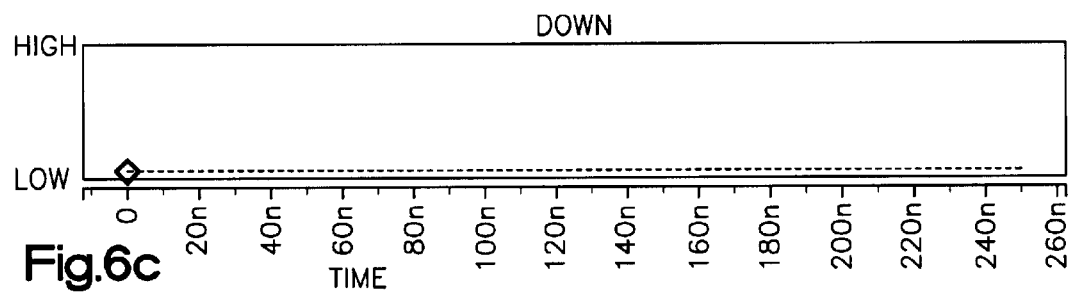
Figure 6D:
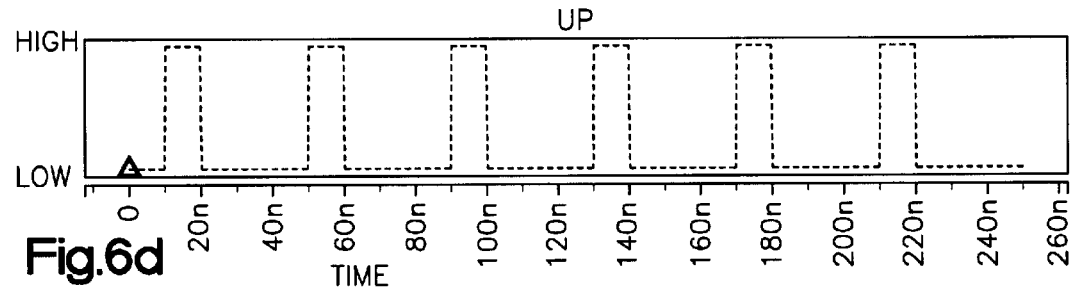
Figure 6E:
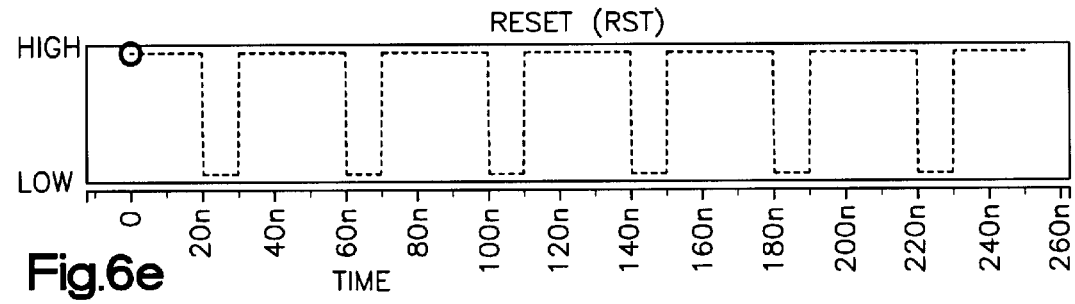

Referring now to FIGS. 4 and 6a–6e, the operation of the phase comparator 28 of the first embodiment when the reference clock signal (FIG. 6b) leads the filter clock signal (FIG. 6a) is illustrated. As a first rising edge 160 of the reference clock signal transitions from low to high, the Q output of the first flip-flop 150 will produce an up pulse (FIG. 6d). The reference clock signal and the up pulse will present logical highs at the inputs of the first OR gate 156, causing the first OR gate 156 to produce a logical high output. However, at this point, the output of the second OR gate 158 will be low, the output of the NAND gate 154 will remain high and the flip-flops 150, 152 will not be reset. Therefore, the up pulse will remain high until a first rising edge 162 of the filter clock signal causes the output of the second OR gate 158 to go high making both inputs to the NAND gate 154 high. This causes the flip-flops 150, 152 to reset and the up pulse to go low. The duration of the up pulse is the length of time between the arrival of the first rising edge 160 of the reference clock signal and the first rising edge 162 of the filter clock signal. This sequence of events will reoccur for each cycle of the filter and reference clock signals until the Gm/C of the proxy filter 22 is adjusted. More specifically, the presence of up pulses and the absence of down pulses will cause the output of the charge pump to increase. The increasing output of the charge pump will result in an increasing correction signal being sent to the proxy filter 22, thereby speeding up the transconductance of the proxy filter 22 which will eventually bring the lagging filter clock signal in phase with the reference clock signal.

Figure 7A:
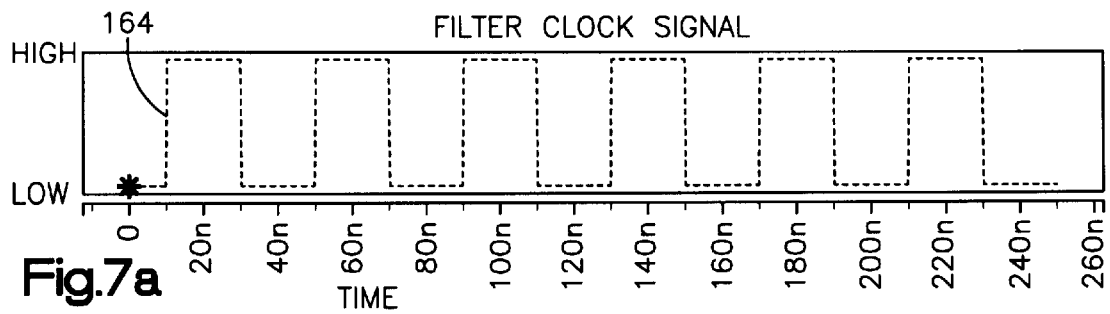
FIGS. 7a–7e are timing diagrams illustrating a third example situation for the first embodiment of the phase comparator.
Figure 7B:
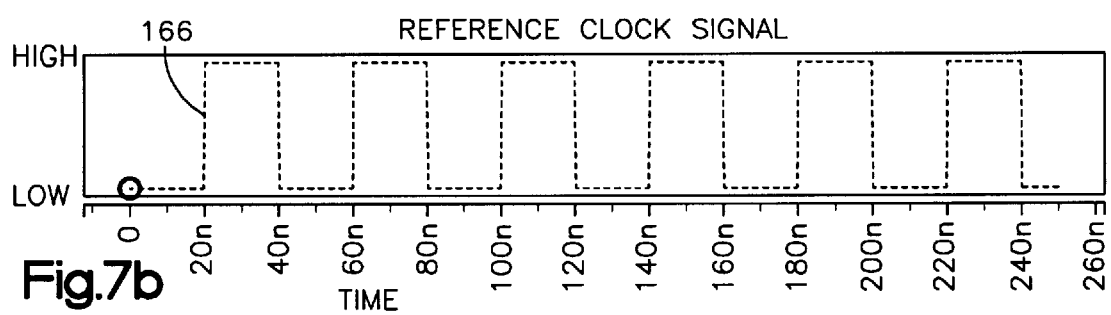
Figure 7C:
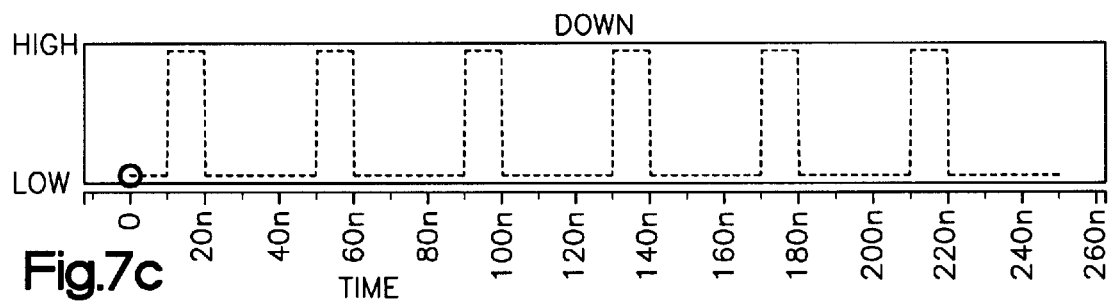
Figure 7D:
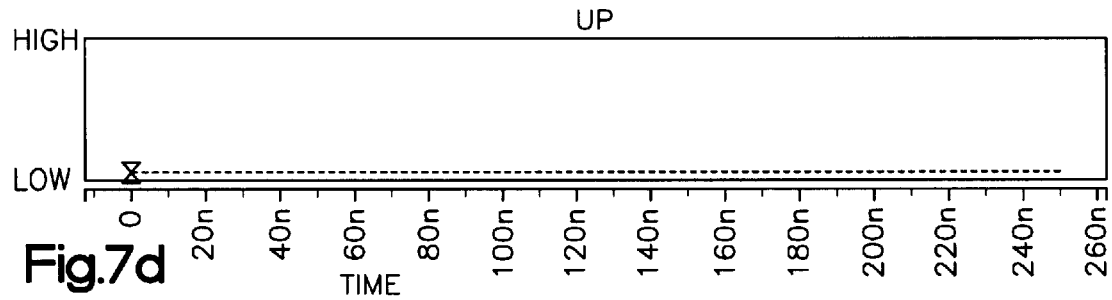
Figure 7E:
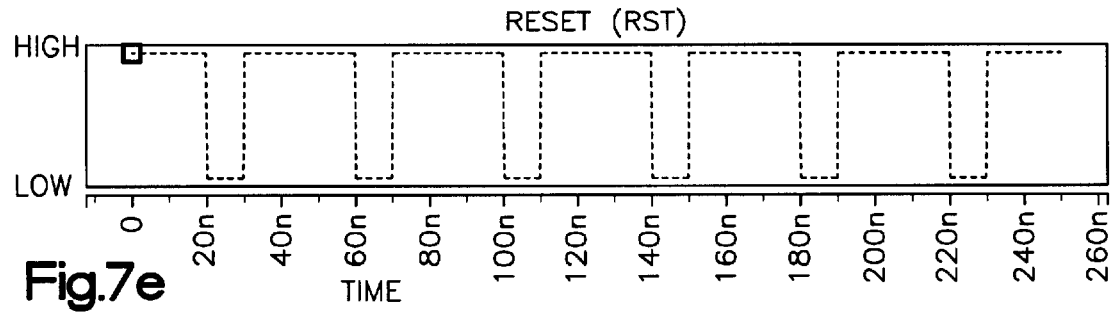

Referring now to FIGS. 4 and 7a–7e, the operation of the phase comparator 28 of the first embodiment when the filter clock signal (FIG. 7a) leads the reference clock signal (FIG. 7b) is illustrated. As one skilled in the art will appreciate, this situation is analogous to the situation illustrated in FIGS. 6a–6b. More specifically, as a first rising edge 164 of the filter clock signal transitions from low to high, the Q output of the second flip-flop 152 will produce a down pulse (FIG. 7c). The filter clock signal and the down pulse will present logical highs at the inputs of the second OR gate 158, causing the second OR gate 158 to produce a logical high output. However, at this point, the output of the first OR gate 156 will be low, the output of the NAND gate 154 will remain high and the flip-flops 150, 152 will not be reset. Therefore, the down pulse will remain high until a first rising edge 166 of the reference clock signal causes the output of the first OR gate 156 to go high making both inputs to the NAND gate 154 high. This causes the flip-flops 150, 152 to reset and the down pulse to go low. The duration of the down pulse is the length of time between the arrival of the first rising edge 164 of the filter clock signal and the first rising edge 166 of the reference clock signal. This sequence of events will reoccur for each cycle of the filter and reference clock signals until the Gm/C of the proxy filter 22 is adjusted. More specifically, the presence of down pulses and the absence of up pulses will cause the output of the charge pump to decrease. The decreasing output of the charge pump will result in a decreasing correction signal being sent to the proxy filter 22, thereby slowing down the transconductance of the proxy filter 22 which will eventually bring the leading filter clock signal in phase with the reference clock signal.

Figure 8A:
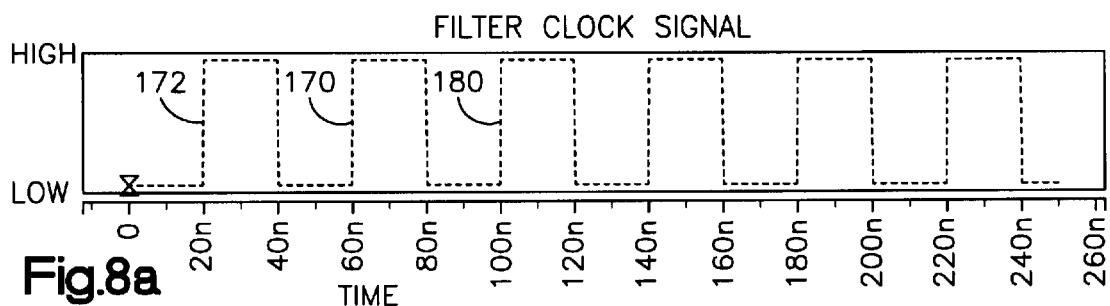
FIGS. 8a–8e are timing diagrams illustrating a fourth example situation for the first embodiment of the phase comparator.
Figure 8B:
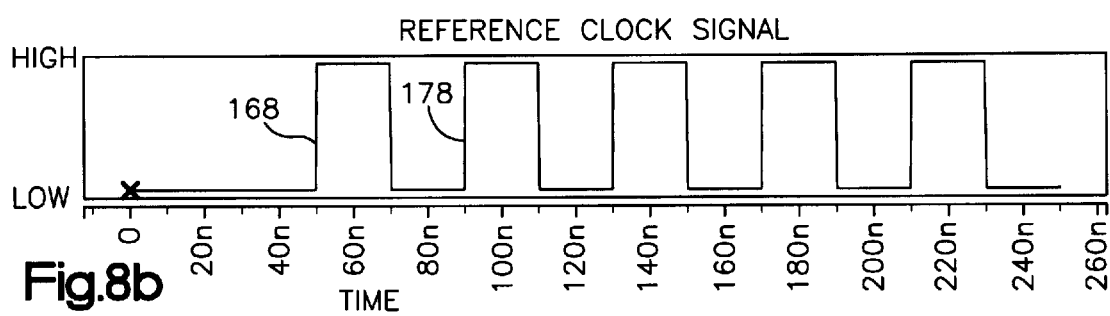

Referring now to FIGS. 4 and 8a–8e, the operation of the phase comparator 28 of the first embodiment when the reference clock signal (FIG. 8b) leads the filter clock signal (FIG. 8a) but the reference clock signal is missing for one or more cycles is illustrated. It is noted that the same situation results if the reference clock signal leads the filter clock signal, but the reference clock signal has been delayed one or more cycles rather than missing. In either case, the phase comparator 28 appropriately compares corresponding pairs of reference and filter clock cycles for use with the transconductance compensation circuit 10. More specifically, the phase comparator 28 compares corresponding pairs of rising edges, such as rising edge 178 (FIG. 8b) and rising edge 180 (FIG. 8a), rather than rising edge 168 (FIG. 8b) and rising edge 172 (FIG. 8a).

As will become more apparent from the discussion below, the phase comparator 28 recovers from a potential cycle slipping situation indicated by when a first rising edge of the reference clock signal, such as rising edge 168, is more that 180° out of phase with a first rising edge of the filter clock signal, such as rising edge 172. The phase comparator 28 uses this recovery operation to avoid generating the result found with the conventional phase comparator 300 illustrated in FIG. 16 and described in more detail above. This is important since the 180° delay filter, or proxy filter 22, is a transconductance filter that is not tolerant to cycle slipping. Therefore, the proxy filter 22, for purposes of Gm/C compensation, should not be considered more than 180° out of phase with the reference clock signal. The determination of whether the rising edges are more than 180° out of phase will be referred to herein as a "wrong up signal" or a "wrong down signal" as the case may be. In the situation illustrated in FIGS. 8a–8e, the condition being avoided is wrong down condition.

Figure 8C:
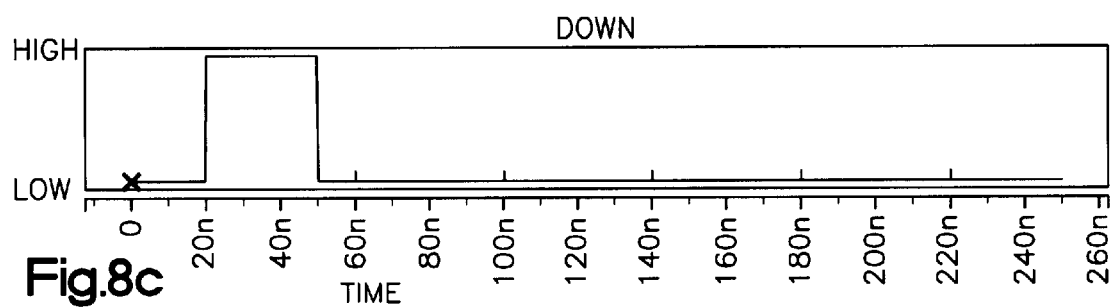

As a first rising edge of the filter clock signal, such as rising edge 172, transitions from low to high, the Q output of the second flip-flop 152 will produce a down pulse (FIG. 8c). The filter clock signal and the down pulse will present logical highs at the inputs of the second OR gate 158, causing the second OR gate 158 to produce a logical high output. However, at this point, the output of the first OR gate 156 will be low, the output of the NAND gate 154 will remain high and the flip-flops 150, 152 will not be reset. Therefore, the down pulse and the output of the second OR gate 158 will remain high until the first rising edge 168 of the reference clock signal causes the output of the first OR gate 156 to go high making both inputs to the NAND gate 154 high. This causes the output of the NAND gate 154 to go low (FIG. 8e, reset pulse 174), the flip-flops 150, 152 to reset and the down pulse to go low. The duration of the down pulse is the length of time between the arrival of the first rising edge 172 of the filter clock signal and the first rising edge 168 of the reference clock signal.

Figure 8D:
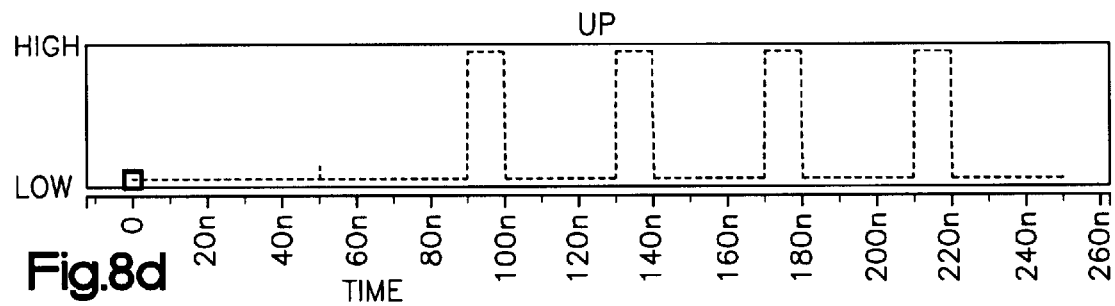
Figure 8E:
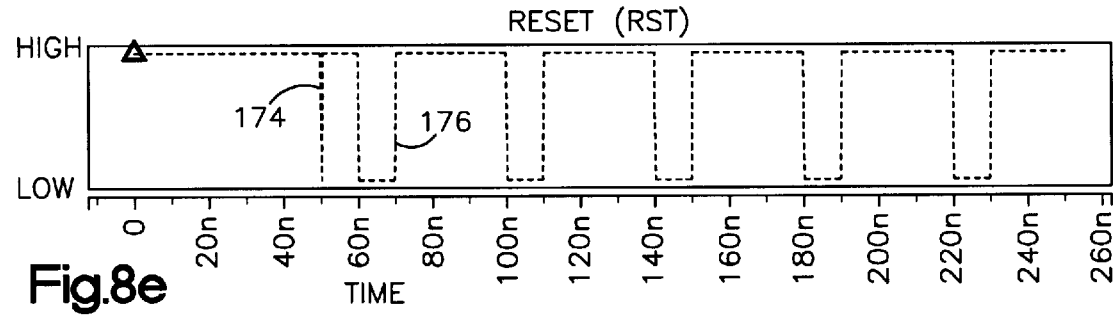

After the flip-flops have been reset, the reference clock signal remains high and produces a high output from the first OR gate 156. The output of the second OR gate 158 will be low since neither the filter clock signal nor the down pulse are high. Therefore the reset signal RST will be high. As the next rising edge 170 of the filter clock signal arrives, the filter clock signal will cause the output of the second OR gate 158 to go high and, with the high output of the first OR gate 156, will invoke the reset signal RST to again reset the flip-flops 150, 152 (FIG. 8e, reset pulse 176). The generation of two reset pulses during the high portion of the reference clock signal indicates that the rising edge of the reference clock signal and the rising edge of the filter clock signal being compared are more that 180° out of phase. The down pulse which is generated is therefore considered incorrect, or wrong down.

By resetting the flip-flops 150, 152 after the arrival of the second rising edge 170 of the filter clock signal, the phase comparator will commence operating as described above with respect to FIGS. 6a–6e, thereby recovering from a potential cycle slipping situation. More specifically, corresponding pairs of reference and filter clock signal rising edges will be compared, such as rising edges 178 and 180. Briefly, as the rising edge 178 of the reference clock signal transitions from low to high, the Q output of the first flip-flop 150 will produce an up pulse (FIG. 8d). The reference clock signal and the up pulse will present logical highs at the inputs of the first OR gate 156, causing the first OR gate 156 to produce a logical high output. However, at this point, the output of the second OR gate 158 will be low, the output of the NAND gate 154 will remain high and the flip-flops 150, 152 will not be reset. Therefore, the up pulse will remain high until the rising edge 180 of the filter clock signal causes the output of the second OR gate 158 to go high making both inputs to the NAND gate 154 high. This causes the flip-flops 150, 152 to reset and the up pulse to go low. The duration of the up pulse is the length of time between the arrival of the rising edge 178 of the reference clock signal and the rising edge 180 of the filter clock signal. This sequence of events will reoccur for each cycle of the filter and reference clock signals until the Gm/C of the proxy filter 22 is adjusted. More specifically, the presence of up pulses and the absence of down pulses will cause the output of the charge pump to increase. The increasing output of the charge pump will result in an increasing correction signal being sent to the proxy filter 22, thereby speeding up the transconductance of the proxy filter 22 which will eventually bring the lagging filter clock signal in phase with the reference clock signal.

Figure 9A:
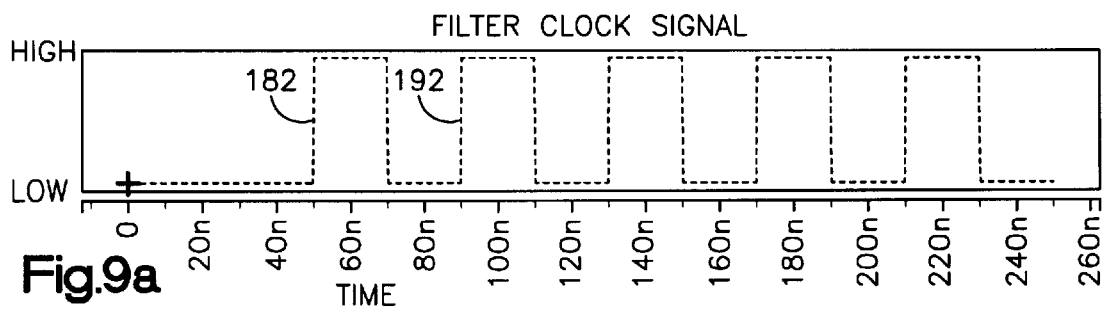
FIGS. 9a–9e are timing diagrams illustrating a fifth example situation for the first embodiment of the phase comparator.
Figure 9B:
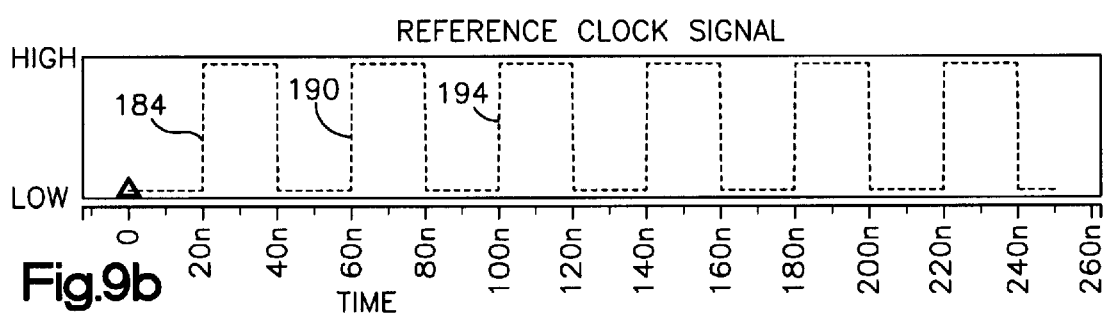

Referring now to FIGS. 4 and 9a–9e, the operation of the phase comparator 28 of the first embodiment when the filter clock signal (FIG. 9a) leads the reference clock signal (FIG. 9b) but the filter clock signal is missing for one or more cycles is illustrated. It is noted that the same situation results if the filter clock signal leads the reference clock signal, but the filter clock signal has been delayed one or more cycles rather than missing. In either case, for use with the transconductance compensation circuit 10, the phase comparator 28 appropriately compares corresponding pairs of reference and filter clock cycles. More specifically, the phase comparator 28 compares corresponding pairs of rising edges, such as rising edge 192 (FIG. 9a) and rising edge 194 (FIG. 9b), rather than rising edge 182 (FIG. 9a) and rising edge 184 (FIG. 9b).

As will become more apparent from the discussion below, the phase comparator 28 recovers from a potential cycle slipping situation indicated by when a first rising edge of the filter clock signal, such as rising edge 182, is more that 180° out of phase with a first rising edge of the reference clock signal, such as rising edge 184. The phase comparator 28 uses this recovery operation to avoid generating the result found with the conventional phase comparator 300 illustrated in FIG. 16 and described in more detail above. In the situation illustrated in FIGS. 9a–9e, the condition being avoided is a wrong up condition.

Figure 9C:
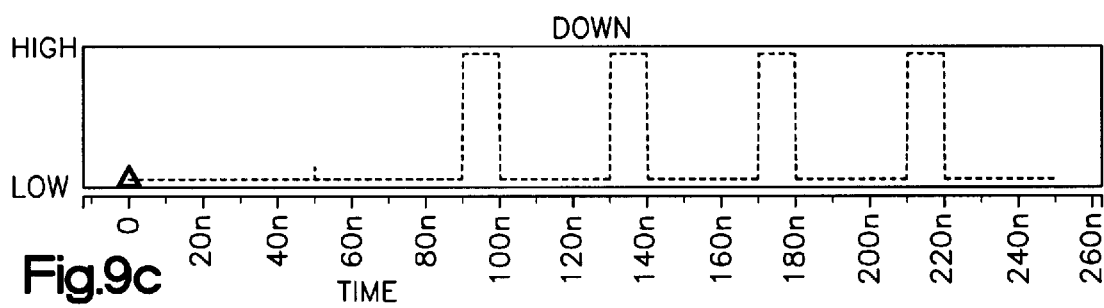
Figure 9D:
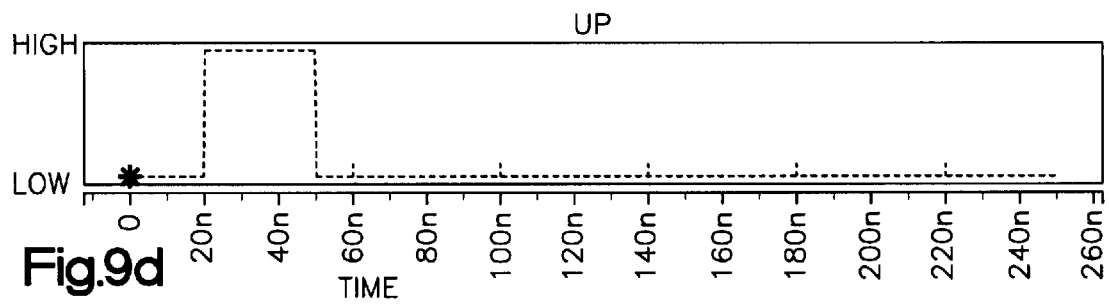

As a first rising edge of the reference clock signal, such as rising edge 184, transitions from low to high, the Q output of the first flip-flop 150 will produce an up pulse (FIG. 9d). The reference clock signal and the up pulse will present logical highs at the inputs of the first OR gate 156, causing the first OR gate 156 to produce a logical high output. However, at this point, the output of the second OR gate 158 will be low, the output of the NAND gate 154 will remain high and the flip-flops 150, 152 will not be reset. Therefore, the up pulse and the output of the second OR gate 158 will remain high until the first rising edge 182 of the filter clock signal causes the output of the second OR gate 158 to go high making both inputs to the NAND gate 154 high. This causes the output of the NAND gate 154 to go low (FIG. 9e, reset pulse 186), the flip-flops 150, 152 to reset and the up pulse to go low. The duration of the up pulse is the length of time between the arrival of the first rising edge 184 of the reference clock signal and the first rising edge 182 of the filter clock signal.

Figure 9E:
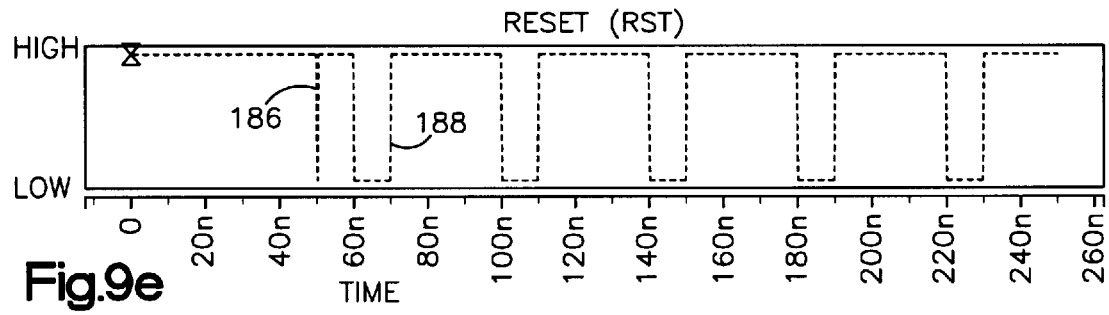

After the flip-flops have been reset, the filter clock signal remains high and produces a high output from the first OR gate 156. The output of the first OR gate 156 will be low since neither the reference clock signal nor the up pulse are high. Therefore the reset signal RST will be high. As the next rising edge 190 of the reference clock signal arrives, the reference clock signal will cause the output of the first OR gate 156 to go high and, with the high output of the second OR gate 158, will invoke the reset signal RST to again reset the flip-flops 150, 152 (FIG. 9e, reset pulse 188). The generation of two reset pulses during the high portion of the filter clock signal indicates that the rising edge of the reference clock signal and the rising edge of the filter clock signal being compared are more that 180° out of phase. The up pulse which is generated is therefore considered incorrect, or wrong up.

By resetting the flip-flops 150, 152 after the arrival of the second rising edge 190 of the reference clock signal, the phase comparator will commence operating as described above with respect to FIGS. 7a–7e, thereby recovering from a potential cycle slipping situation. More specifically, corresponding pairs of reference and filter clock signal rising edges will be compared, such as rising edges 192 and 194. Briefly, as the rising edge 192 of the filter clock signal transitions from low to high, the Q output of the second flip-flop 152 will produce a down pulse (FIG. 9c). The filter clock signal and the down pulse will present logical highs at the inputs of the second OR gate 158, causing the second OR gate 158 to produce a logical high output. However, at this point, the output of the first OR gate 156 will be low, the output of the NAND gate 154 will remain high and the flip-flops 150, 152 will not be reset. Therefore, the down pulse will remain high until the rising edge 194 of the reference clock signal causes the output of the first OR gate 156 to go high making both inputs to the NAND gate 154 high. This causes the flip-flops 150, 152 to reset and the down pulse to go low. The duration of the down pulse is the length of time between the arrival of the rising edge 192 of the filter clock signal and the rising edge 194 of the reference clock signal. This sequence of events will reoccur for each cycle of the filter and reference clock signals until the Gm/C of the proxy filter 22 is adjusted. More specifically, the presence of down pulses and the absence of up pulses will cause the output of the charge pump to decrease. The decreasing output of the charge pump will result in a decreasing correction signal being sent to the proxy filter 22, thereby slowing down the transconductance of the proxy filter 22 which will eventually bring the leading filter clock signal in phase with the reference clock signal.

It is noted that the situation where the reference clock signal lags the filter clock signal, but the reference clock signal is missing or delayed for one or more cycles, is not generally of concern since the first embodiment of the phase comparator 28 will begin to operate properly on its own (e.g., as illustrated in FIGS. 7a–7e). The same is true for the situation when the filter clock signal lags the reference clock signal, but the filter clock signal is missing or delayed for one or more cycles (e.g., FIGS. 6a–6e).

In summary, the phase comparator 28 of the first embodiment address the potential cycle slipping situation of the conventional phase comparator by resetting flip-flops 150, 152 when both of the following conditions are met. The first condition is met when one of the reference clock signal is high or the up pulse is high. The second condition is met when one the filter clock signal is high or the down pulse is high.

Figure 17A:
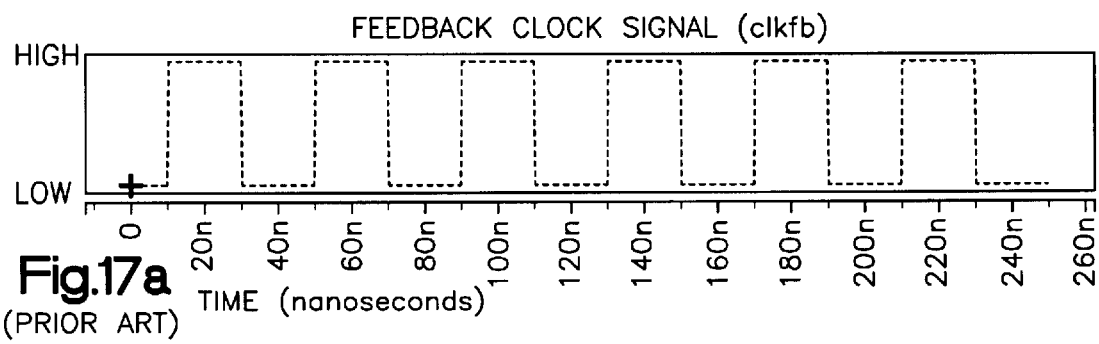
FIGS. 17a–17e are timing diagrams illustrating a first example situation for the conventional phase comparator.
Figure 17B:
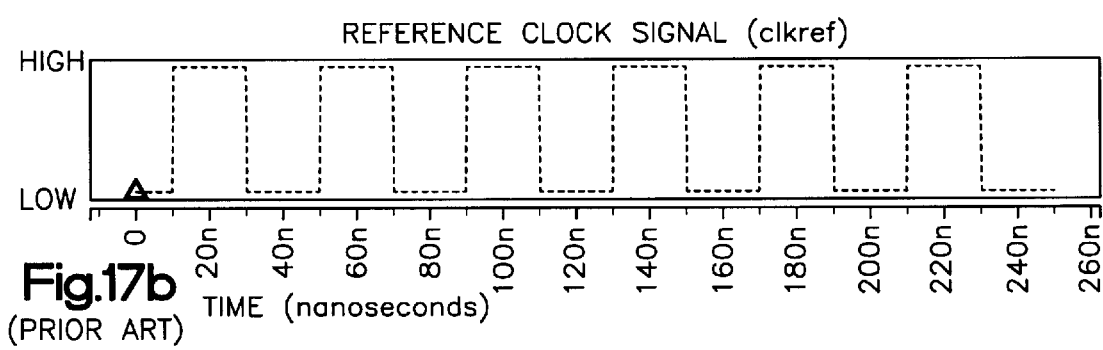
Figure 17C:
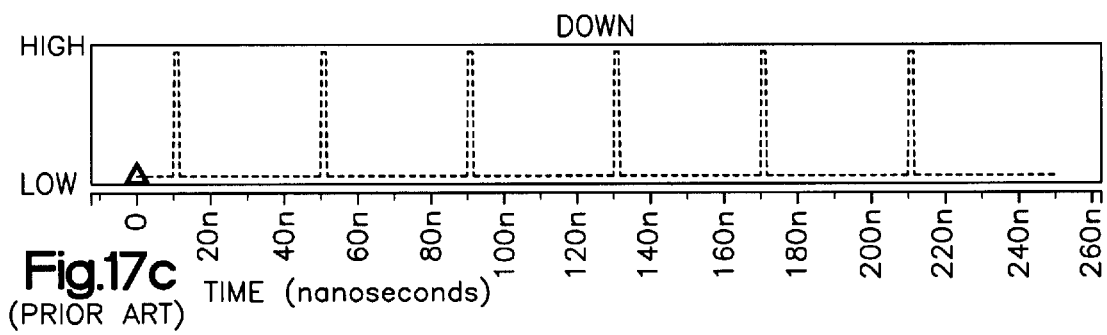
Figure 17D:
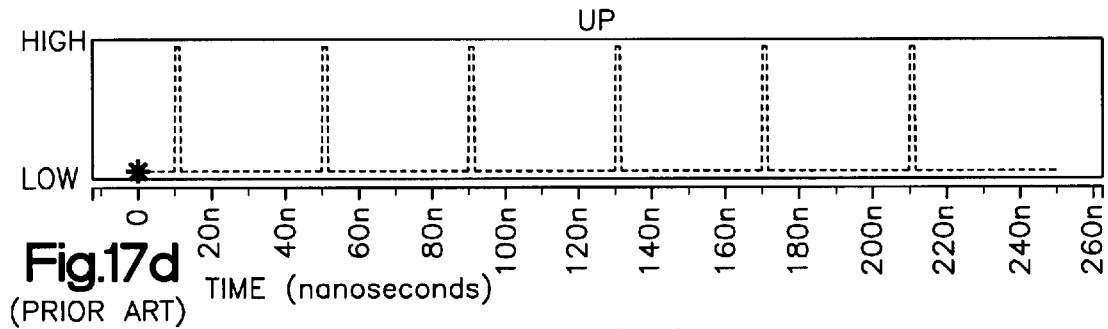
Figure 17E:
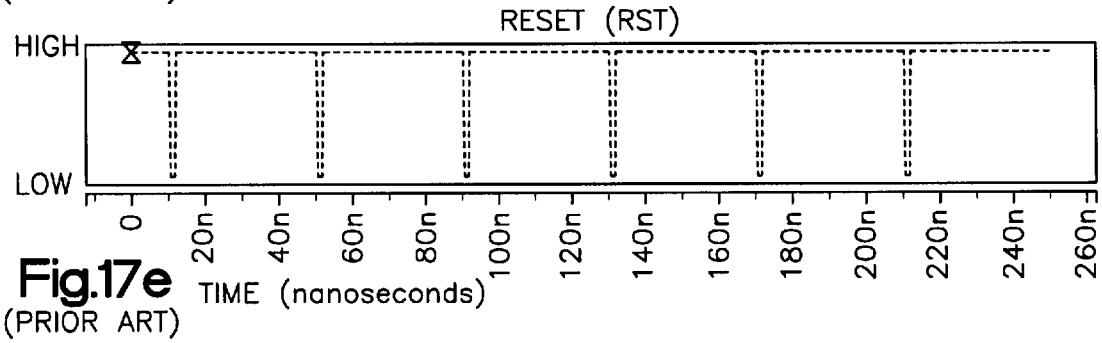
Figure 18A:
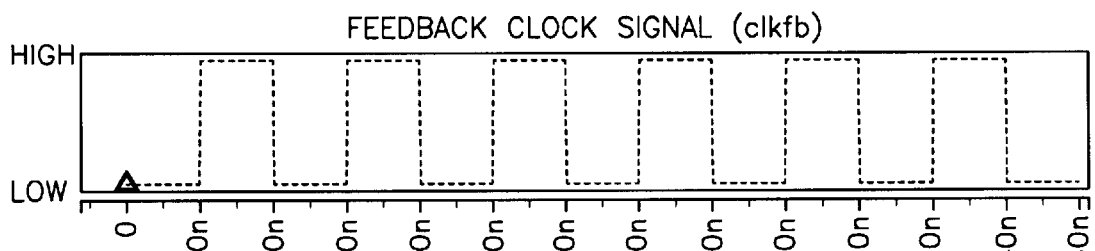
FIGS. 18a–18e are timing diagrams illustrating a second example situation for the conventional phase comparator.
Figure 18B:
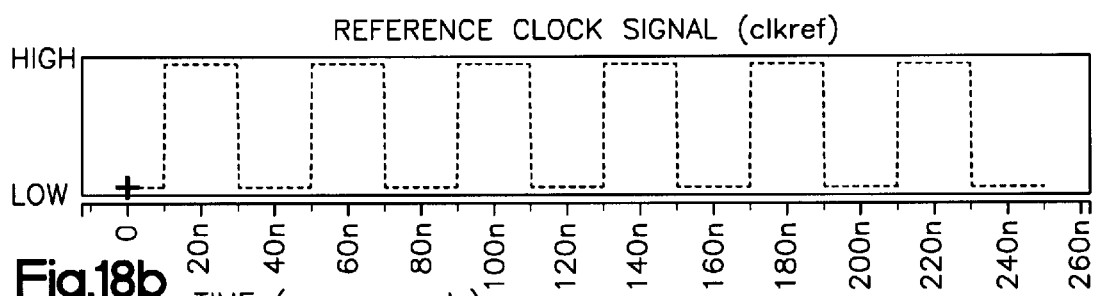
Figure 18C:
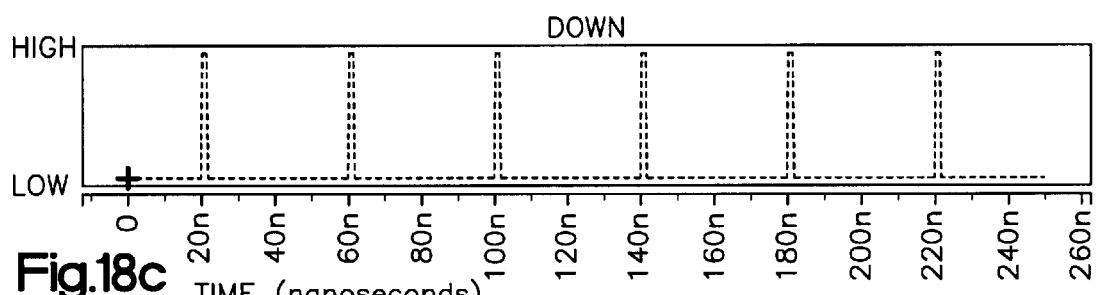
Figure 18D:
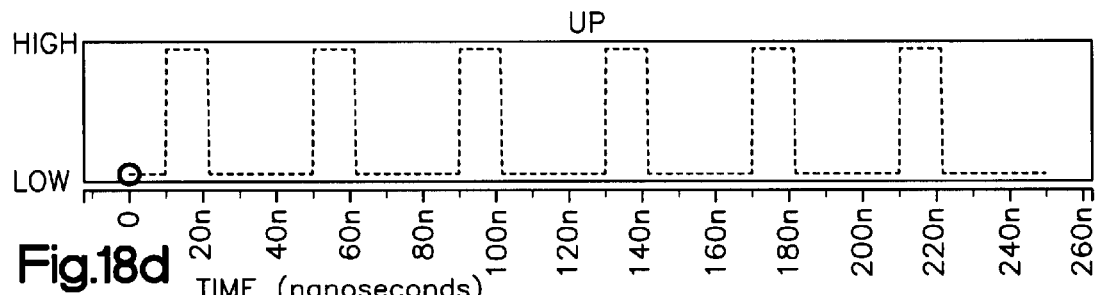
Figure 18E:
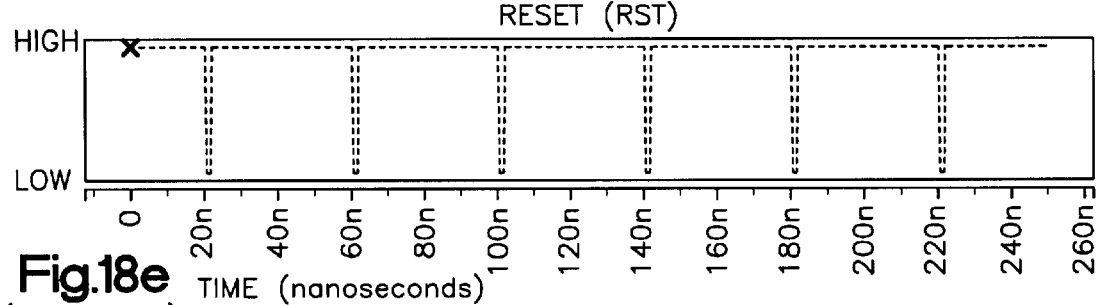
Figure 19A:
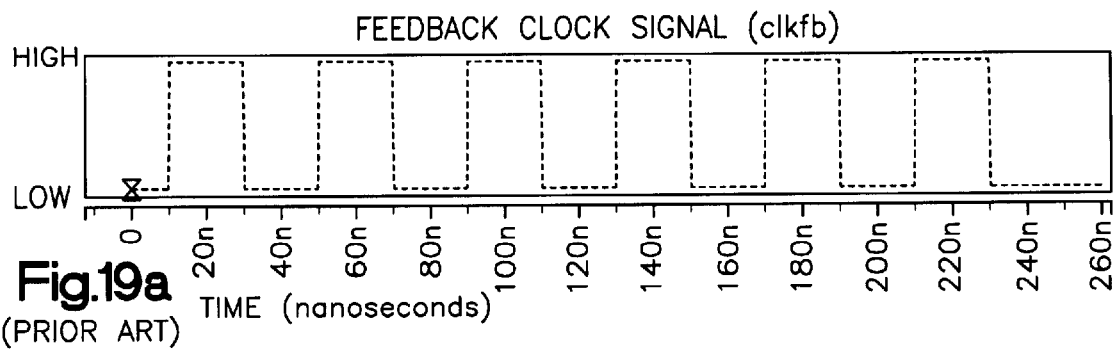
FIGS. 19a–19e are timing diagrams illustrating a third example situation for the conventional phase comparator.
Figure 19B:
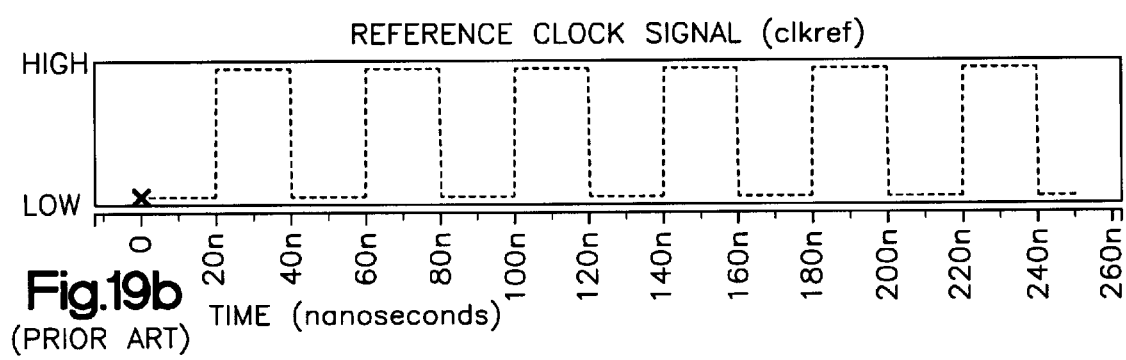
Figure 19C:
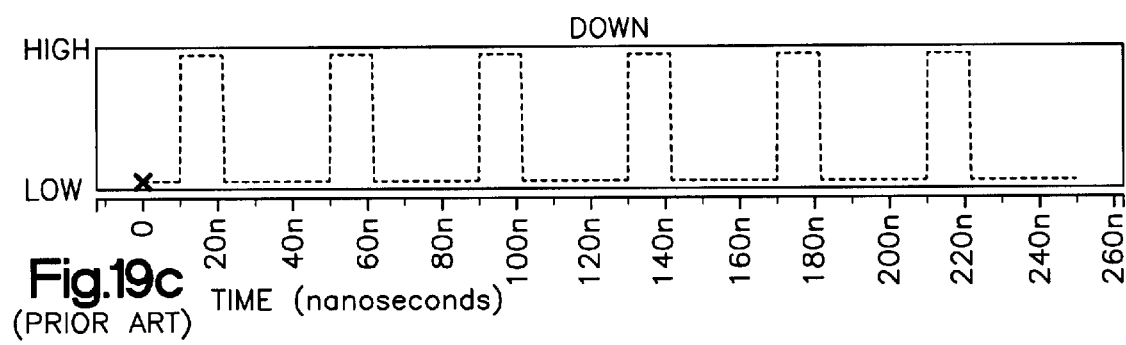
Figure 19D:
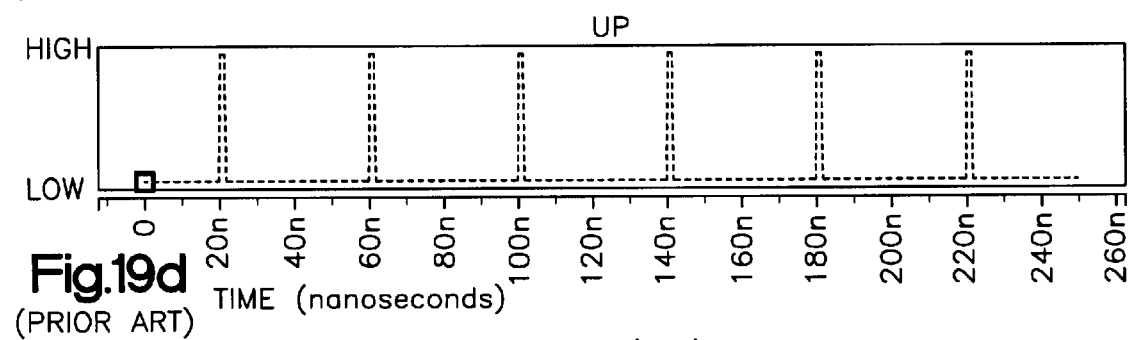
Figure 19E:
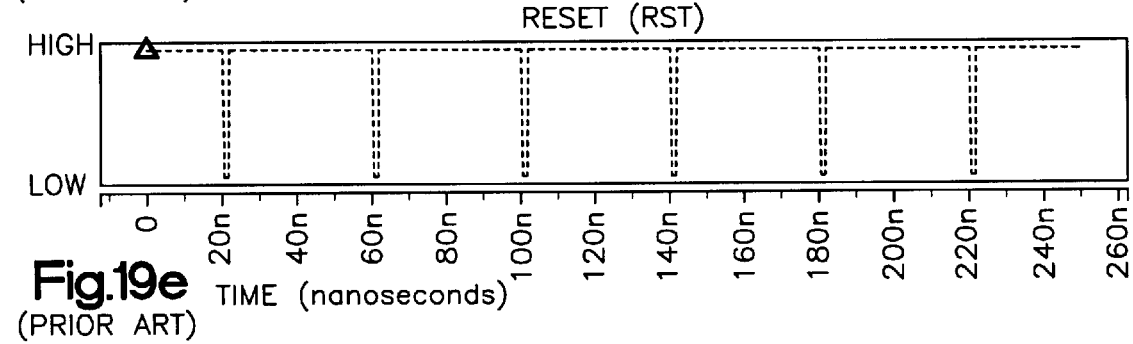

As mention above, the charge pump 22 is a conventional charge pump, such as found in may PLL circuits. Some conventional charge pump circuit configurations may expect to receive coincident up and down pulses of short duration for the situation when the reference clock signal and the filter clock signal (feedback clock signal for PLL circuits) are in phase. An example of the generation of these pulses is illustrated in FIGS. 17c and 17d. These pulses may be used to help the charge pump maintain a stable output. Conventional circuits may also expect short up pulses (FIG. 19d) even when down pulses (FIG. 19c) are being produced to decrease the output of the charge pump and vice versa (18c and 18d). However, there are also a number of known charge pump circuit configurations which do not require the receipt of these pulses to maintain a stable output. Since the phase comparator 28 of the first embodiment does not produce the short up and down pulses under these conditions, the phase comparator 28 of the first embodiment is suited for use with a charge pump that does not require periodic up and down pulses to maintain a stable output.

Alternatively, the phase comparator 28 of the first embodiment can be modified to generate such short up and down pulses if desired. For example, delays can be inserted at the inputs of the OR gates 156, 158 to delay the resetting of the flip-flops 150, 152 and allow the generation of the short up and down pulses. The delays can be implemented with a plurality of inverters connected in series. The duration of each delay is the same, or approximately the same, as the duration of the desired up and down pulses.

Second Embodiment

Figure 10:
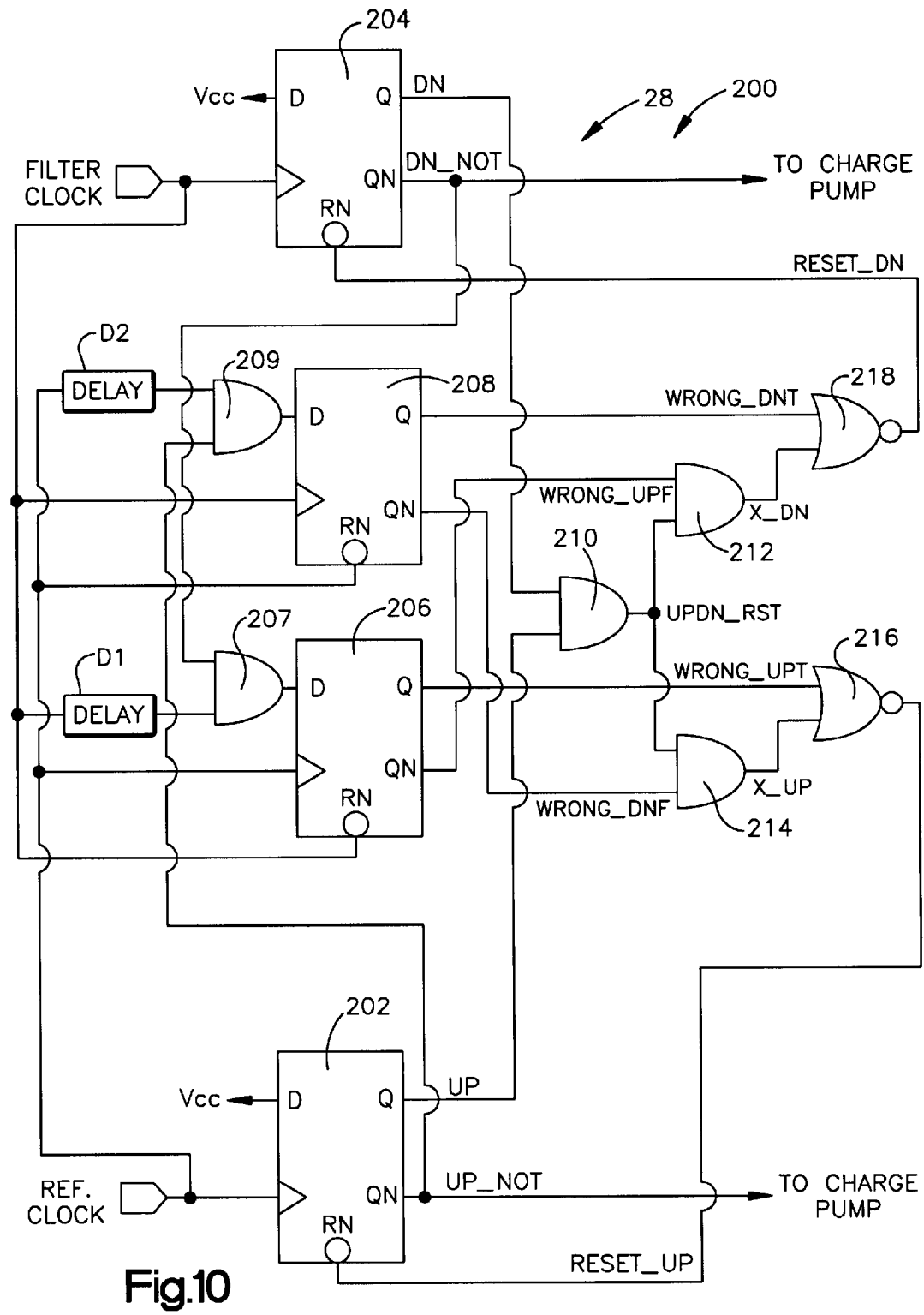
FIG. 10 is a schematic of a phase comparator according to a second embodiment.

Referring now to FIG. 10, the phase comparator 28 of the second embodiment, or phase comparator 200, will be described. Similar to the phase comparator 28 of the first embodiment, the phase comparator 200 has a first flip-flip 202 and a second flip-flop 204. Each of the flip-flops 202, 204 are rising edge triggered D-type flip-flops having their D inputs connected to logic high, or Vcc. Each of the flip-flops 150, 152 will reset upon receiving a logic low at a reset input, or RN. One skilled in the art will appreciate that other types of latches or circuit components may be used in place of the D-type flip- flops.

It is noted that the illustrated phase comparator 200 sends up and down pulses to the charge pump 32 from the inverting outputs, QN, of the flip-flops 202, 204. One skilled in the art will appreciate that if the charge pump 32 is not expecting inverted up and down pulses, the noninverting outputs, Q, can be connected to the charge pump 32.

The phase comparator 200 has a second pair of D type flip-flops 206, 208 used for respectively generating wrong up and wrong down signals. The flip-flops 206, 208 are respectively clocked by the filter clock signal and the reference clock signal. One skilled in the art will appreciate that other types of latches or circuit components may be used in place of the D-type flip-flops used to generate the wrong up and wrong down signals.

Figure 22:
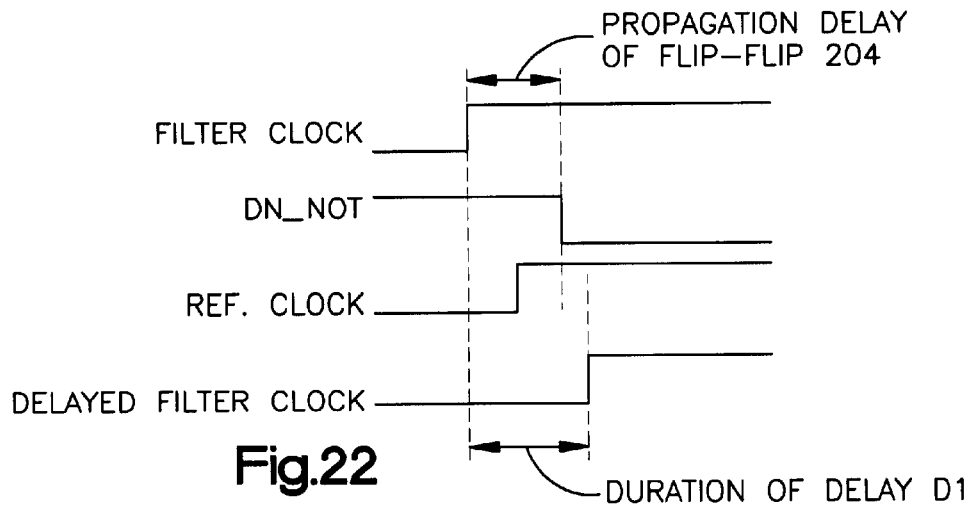
FIG. 22 is a timing diagram illustrating a first delay operation of the second embodiment of the phase comparator.

The D input of the flip-flop 206 is connected to the output of an AND gate 207. A first input of the AND gate 207 is connected to the inverting output QN of the second flip-flop 204 for receiving inverted down pulses, or DN_NOT. A second input of the AND gate 207 is connected to the filter clock signal through a delay D1. The delay D1 can be implemented with a plurality of inverters connected in series. With additional reference to FIG. 22, the duration of the delay D1 is selected to delay the filter clock signal to arrive at the AND gate 207 shortly after or at the same time as the arrival of a DN_NOT signal. In other words, the duration of the delay D1 is the same or slightly longer than the propagation delay of the second flip-flop 204. The delay D1 is used to avoid the generation of a wrong up signal in the event that the filter clock signal leads the reference clock signal (used to clock the flip-flop 206) by a small amount, the small amount being less than the propagation delay of the of the second flip-flop 204 such that the reference clock signal arrives before the DN_NOT signal goes low.

Figure 23:
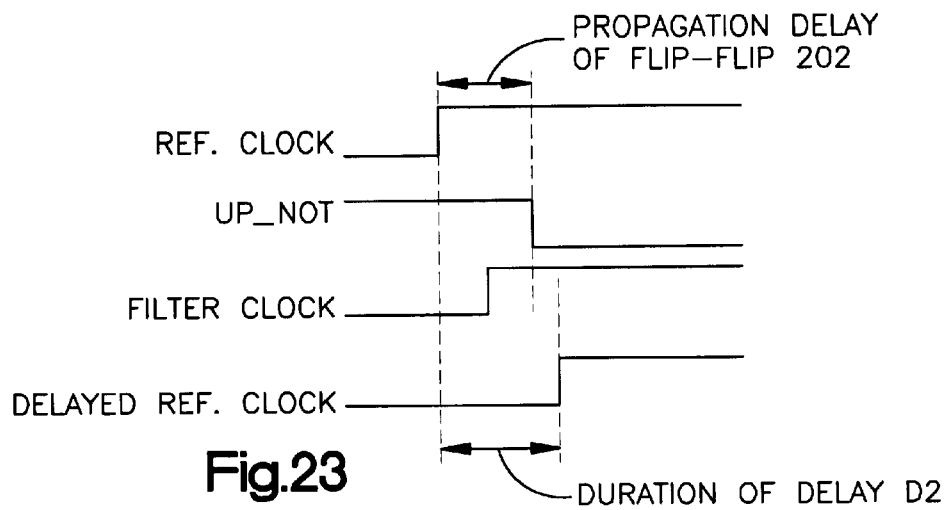
FIG. 23 is a timing diagram illustrating a second delay operation of the second embodiment of the phase comparator.

The D input of the flip-flop 208 is connected to the output of an AND gate 209. A first input of the AND gate 209 is connected to the inverting output QN of the first flip-flop 202 for receiving inverted up pulses, or UP_NOT. A second input of the AND gate 209 is connected to the reference clock signal through a delay D2. The delay D2 can be implemented with a plurality of inverters connected in series. With additional reference to FIG. 23, the duration of the delay D2 is selected to delay the reference clock signal to arrive at the AND gate 209 shortly after or at the same time as the arrival of a UP_NOT signal. In other words, the duration of the delay D2 is the same or slightly longer than the propagation delay of the first flip-flop 202. The delay D2 is used to avoid the generation of a wrong down signal in the event that the reference clock signal leads the filter clock signal (used to clock the flip-flop 208) by a small amount, the small amount being less than the propagation delay of the of the first flip-flop 202 such that the filter clock signal arrives before the UP_NOT signal goes low.

Figure 11A:
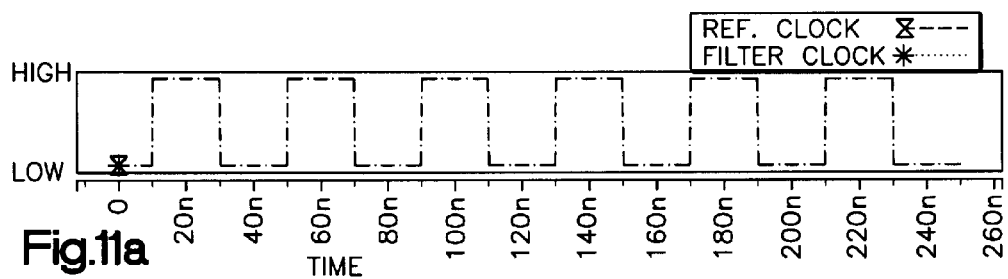
FIGS. 11a–11f are timing diagrams illustrating a first example situation for the second embodiment of the phase comparator.
Figure 11B:
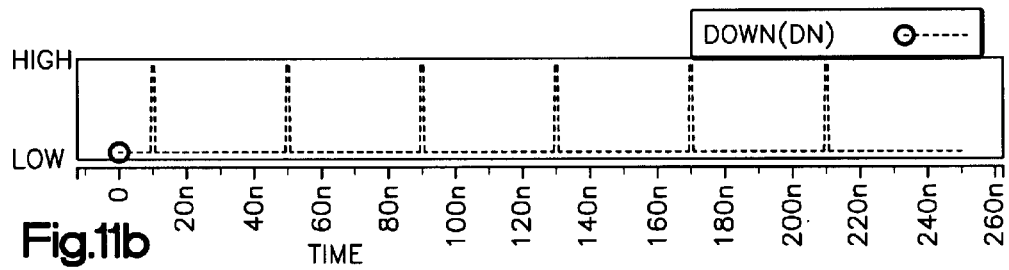
Figure 11C:
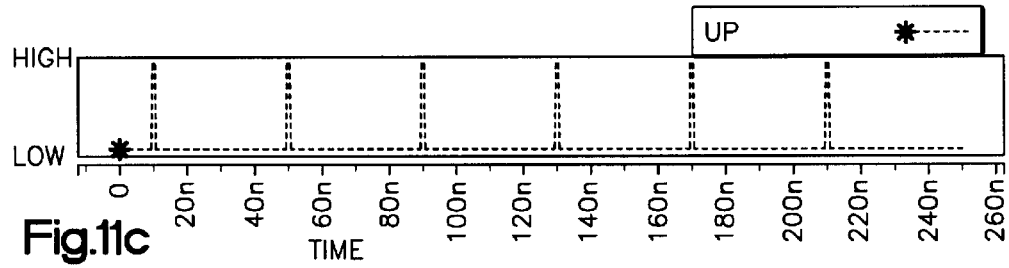
Figure 11D:
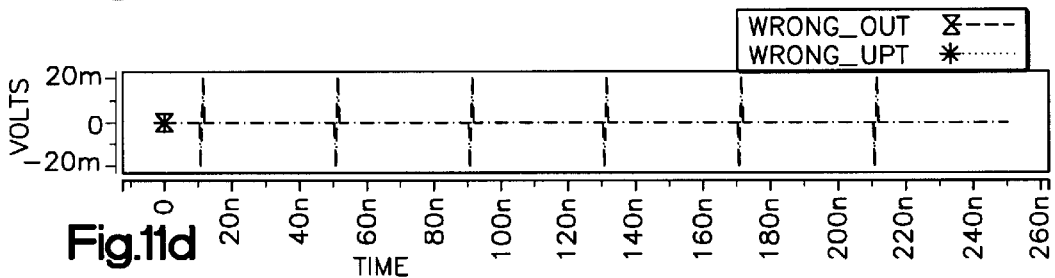
Figure 11E:
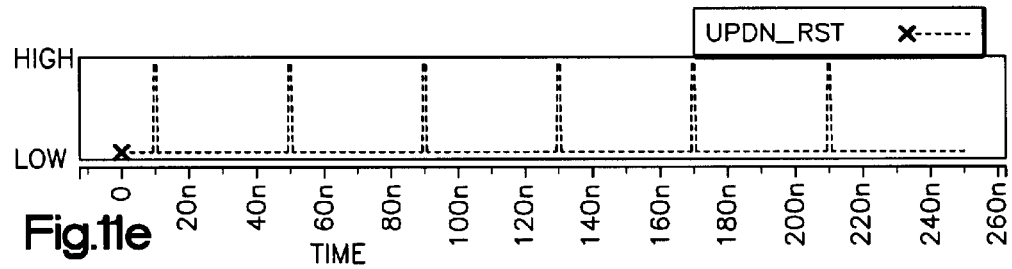
Figure 11F:
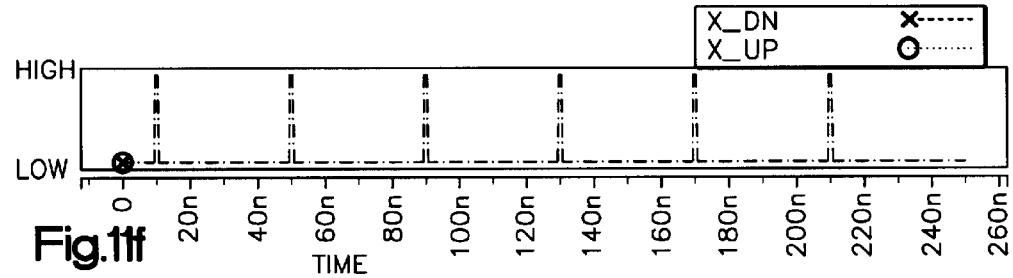

With additional reference to FIGS. 11a–11f, the operation of the phase comparator 200 when the reference and filter clock signals (coincident signals in FIG. 11a) are in phase is illustrated. As the reference clock signal transitions from low to high, the Q output of the first flip-flop 202 will go high and generate an up pulse (FIG. 11c). As the filter clock signal transitions from low to high, the Q output of the second flip-flop 204 will go high and generate a down pulse (FIG. 11b). At this time, the Q outputs of the flip-flops 206, 208, or wrong up true (WRONG_UPT) and wrong down true (WRONG_DNT) respectively (FIG. 11d) will be logical low. It is noted that the vertical axis of FIG. 11d is in volts and the peak voltage of WRONG_UPT and WRONG_DNT will not typically exceed 20 millivolts.

The up and down pulses are received at the inputs of an AND gate 210 which generates an up/down reset signal (FIG. 11e, UPDN_RST) at it output. Since the up and down pulses are high, the UPDN_RST signal will go high. The UPDN_RST signal is logically anded with a wrong up false (WRONG_UPF) signal (presently high) output from the flip-flop 206 by an AND gate 212 to generate an X_DN signal (FIG. 11f) which will go high in response to the inputs of the AND gate 212. The UPDN_RST signal is also logically anded with a wrong down false (WRONG_DNF) signal (presently high) output from the flip-flop 208 by an AND gate 214 to generate an X_UP signal (FIG. 11f) which will go high in response to the inputs of the AND gate 214.

The X_UP and WRONG_UPT signals are connected to inputs of a NOR gate 216 and the X_DN and WRONG_DNT signals are connected to inputs of a NOR gate 218. The outputs of the NOR gates 216, 218 are respectively connected to the reset inputs RN of the flip-flops 202, 204. Since the X_UP and X_DN signals both go high in response to the incoming reference and filter clock signal pulses, the outputs of the NOR gates 216, 218 will go low thereby resetting the flip-flops 202, 204 causing the up and down pulses to go low as illustrated in FIGS. 11b and 11c.

Figure 12A:
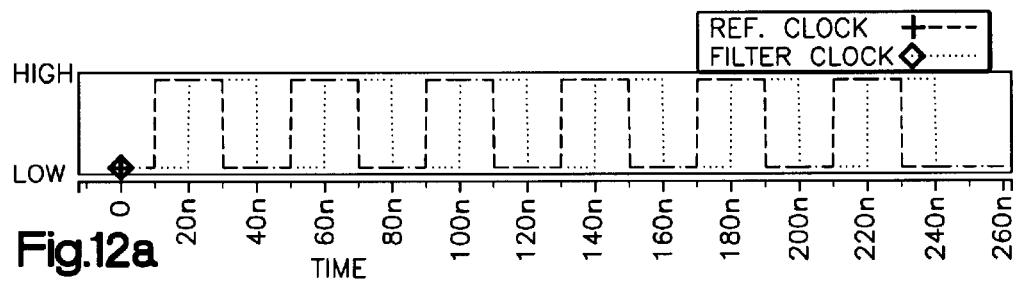
FIGS. 12a–12f are timing diagrams illustrating a second example situation for the second embodiment of the phase comparator.
Figure 12B:
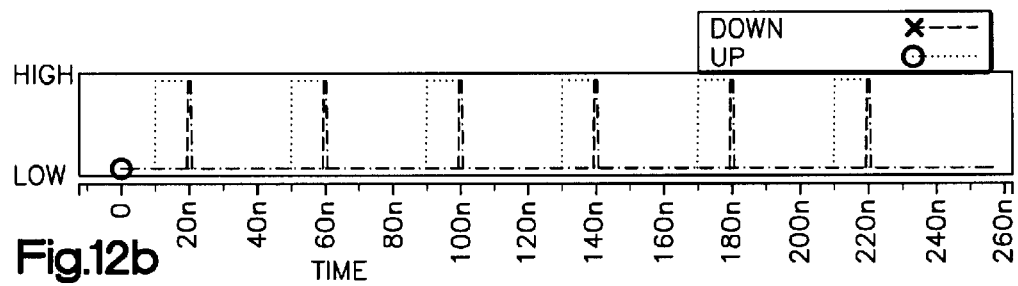
Figure 12C:
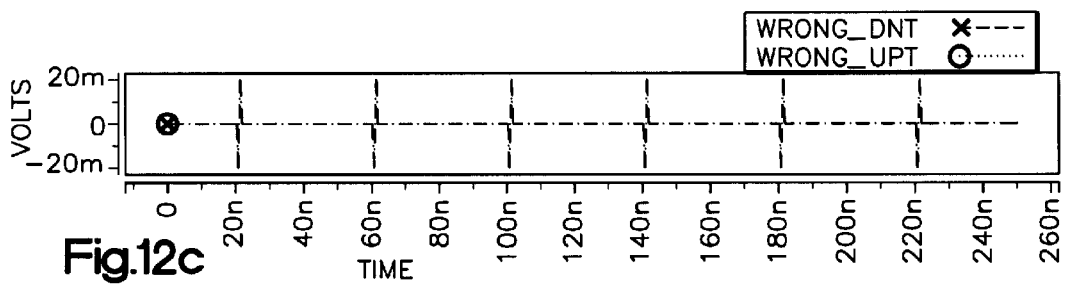
Figure 12D:
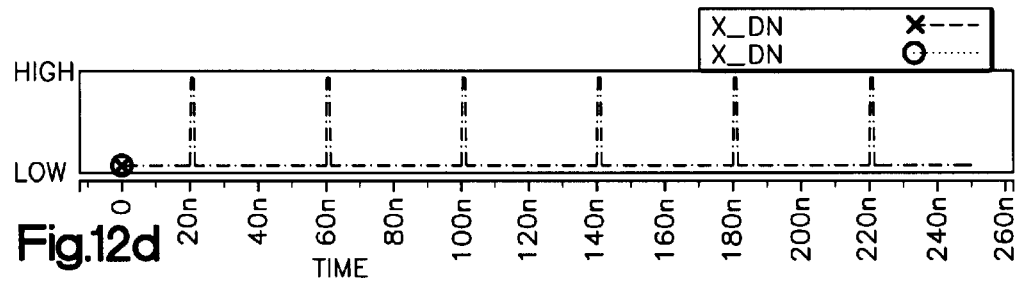
Figure 12E:
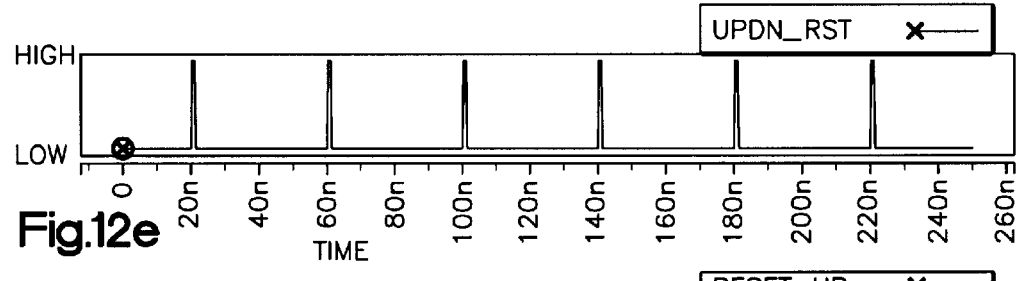
Figure 12F:
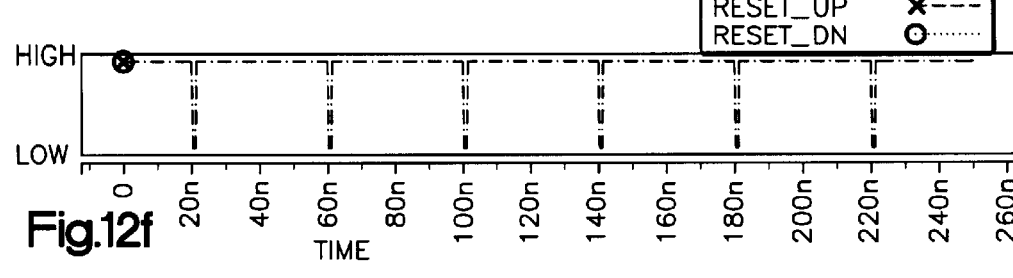

Referring to FIGS. 10 and 12a–12f, the operation of the phase comparator 200 of the second embodiment when the reference clock signal (FIG. 12a) leads the filter clock signal (FIG. 12a) is illustrated. As the reference clock signal transitions from low to high, the Q output of the first flip-flop 202 will go high and generate an up pulse (FIG. 12b). At this time, the Q outputs of the flip-flops 206, 208, or wrong up true (WRONG_UPT) and wrong down true (WRONG_DNT) respectively (FIG. 12c) will be logical low. It is noted that the vertical axis of FIG. 12c is in volts and the peak voltage of WRONG_UPT and WRONG_DNT will not typically exceed 20 millivolts. These conditions will persist until the filter clock signal transitions from low to high and the Q output of the second flip-flop 204 will go high and generate a down pulse (FIG. 12b).

The up and down pulses are received at the inputs of the AND gate 210 which generates an up/down reset signal (FIG. 12e, UPDN_RST) at it output. Since the up and down pulses are high, the UPDN_RST signal will go high. The UPDN_RST signal is logically anded with a wrong up false (WRONG_UPF) signal (presently high) output from the flip-flop 206 by the AND gate 212 to generate an X_DN signal (FIG. 12d) which will go high in response to the inputs of the AND gate 212. The UPDN_RST signal is also logically anded with a wrong down false (WRONG_DNF) signal (presently high) output from the flip-flop 208 by the AND gate 214 to generate an X_UP signal (FIG. 12d) which will go high in response to the inputs of the AND gate 214.

The X_UP and WRONG_UPT signals are connected to inputs of the NOR gate 216 and the X_DN and WRONG_DNT signals are connected to inputs of the NOR gate 218. The outputs of the NOR gates 216, 218 are respectively connected to the reset inputs RN of the flip-flops 202, 204. Since the X_UP and X_DN signals both go high in response to the incoming reference and filter clock signal pulses, the outputs of the NOR gates 216, 218 (FIG. 12f, RESET_UP and RESET_DN respectively) will go low thereby resetting the flip-flops 202, 204 causing the up and down pulses to go low as illustrated in FIG. 12b.

Figure 13A:
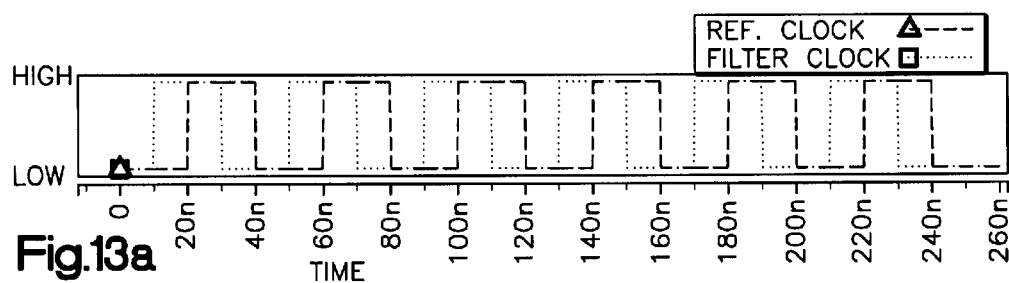
FIGS. 13a–13f are timing diagrams illustrating a third example situation for the second embodiment of the phase comparator.
Figure 13B:
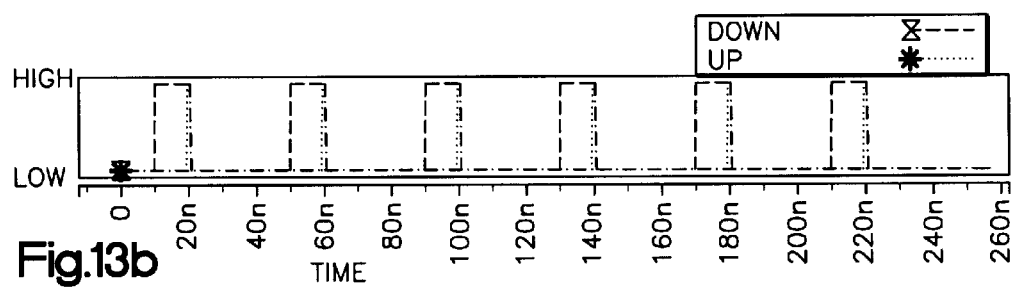
Figure 13C:
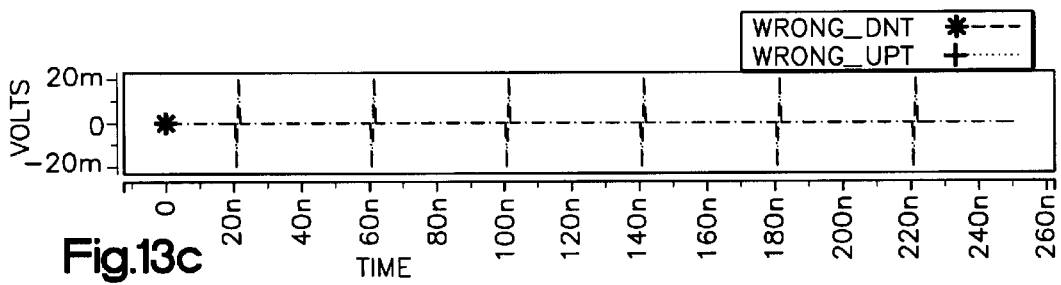
Figure 13D:
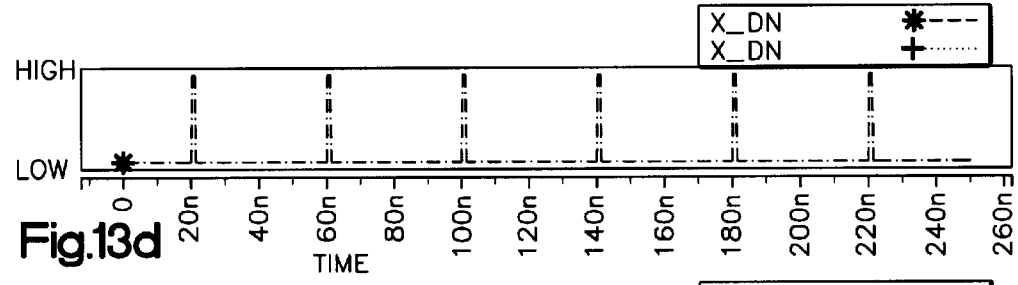
Figure 13E:
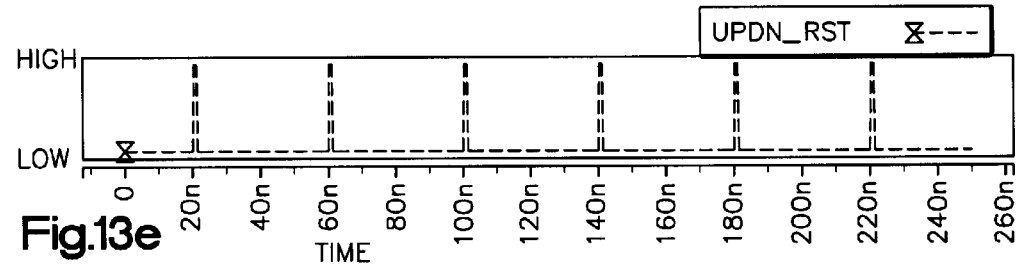
Figure 13F:
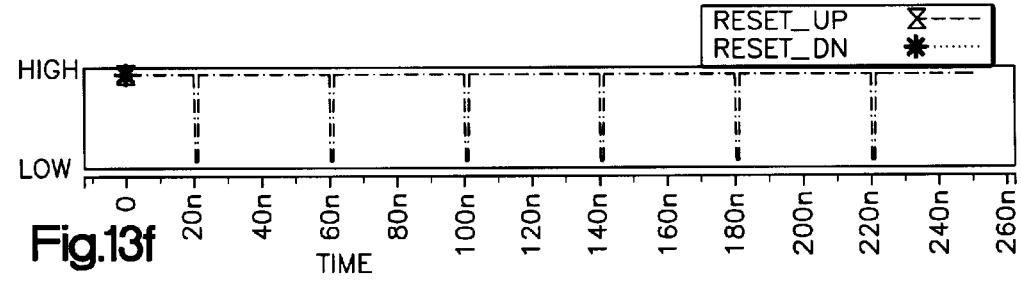

Referring to FIGS. 10 and 13a–13f, the operation of the phase comparator 200 of the second embodiment when the filter clock signal (FIG. 13a) leads the reference clock signal (FIG. 13a) is illustrated. As one skilled in the art will appreciate, this situation is analogous to the situation illustrated in FIGS. 12a–12f. More specifically, as the filter clock signal transitions from low to high, the Q output of the second flip-flop 204 will go high and generate a down pulse (FIG. 13b). At this time, the Q outputs of the flip-flops 206, 208, or wrong up true (WRONG_UPT) and wrong down true (WRONG_DNT) respectively (FIG. 13c) will be logical low. It is noted that the vertical axis of FIG. 13c is in volts and the peak voltage of WRONG_UPT and WRONG_DNT will not typically exceed 20 millivolts. These conditions will persist until the reference clock signal transitions from low to high and the Q output of the first flip-flop 202 will go high and generate an up pulse (FIG. 13b).

The up and down pulses are received at the inputs of the AND gate 210 which generates an up/down reset signal (FIG. 13e, UPDN_RST) at it output. Since the up and down pulses are high, the UPDN_RST signal will go high. The UPDN_RST signal is logically anded with a wrong up false (WRONG_UPF) signal (presently high) output from the flip-flop 206 by the AND gate 212 to generate an X_DN signal (FIG. 13d) which will go high in response to the inputs of the AND gate 212. The UPDN_RST signal is also logically anded with a wrong down false (WRONG_DNF) signal (presently high) output from the flip-flop 208 by the AND gate 214 to generate an X_UP signal (FIG. 13d) which will go high in response to the inputs of the AND gate 214.

The X_UP and WRONG_UPT signals are connected to inputs of the NOR gate 216 and the X_DN and WRONG_DNT signals are connected to inputs of the NOR gate 218. The outputs of the NOR gates 216, 218 are respectively connected to the reset inputs RN of the flip-flops 202, 204. Since the X_UP and X DN signals both go high in response to the incoming reference and filter clock signal pulses, the outputs of the NOR gates 216, 218 (FIG. 13f, RESET_UP and RESET_DN respectively) will go low thereby resetting the flip-flops 202, 204 causing the up and down pulses to go low as illustrated in FIG. 13b.

Referring now to FIGS. 10 and 14a–14f, the operation of the phase comparator 200 of the second embodiment when the reference clock signal (FIG. 14a) leads the filter clock signal (FIG. 14a) but the reference clock signal is missing or delayed for one or more cycles is illustrated. As will become more apparent from the discussion below, the phase comparator 200 recovers from a potential cycle slipping situation indicated by when a first rising edge 220 of the reference clock signal is more than 180 degrees out of phase with a first rising edge 222 of the filter clock signal. The phase comparator 200 uses this recovery operation to avoid generating the result found with the conventional phase comparator 300 illustrated in FIG. 16 and described in more detail above.

As the first rising edge 222 of the filter clock signal transitions from low to high, the Q output of the second flip-flop 204 will go high and generate a down pulse (FIG. 14b). At this time, the Q outputs of the flip-flops 206, 208, or wrong up true (WRONG_UPT) and wrong down true (WRONG_DNT) respectively (FIG. 14c) will be logical low. These conditions will persist until the first rising edge 220 of the reference clock signal transitions from low to high and the Q output of the first flip-flop 202 will go high and generate an up pulse (FIG. 14b).

The up and down pulses are received at the inputs of the AND gate 210 which generates an up/down reset signal (FIG. 14e, UPDN_RST) at it output. Since the up and down pulses are high, the UPDN_RST signal will go high. The UPDN_RST signal is logically anded with a wrong up false (WRONG_UPF) signal (presently high) output from the flip-flop 206 by the AND gate 212 to generate an X_DN signal (FIG. 14d) which will go high in response to the inputs of the AND gate 212. The UPDN_RST signal is also logically anded with a wrong down false (WRONG_DNF) signal (presently high) output from the flip-flop 208 by the AND gate 214 to generate an X_UP signal (FIG. 14d) which will go high in response to the inputs of the AND gate 214.

It is noted that under the conditions illustrated in FIGS. 12a–12b where the reference clock signal leads the filter clock signal, when the reference clock signal goes high the D input to the flip-flop 208 is low. More specifically, the reference clock signal output from the delay D2 is high and UP_NOT is low generating a low output from the AND gate 209 at the time a rising edge of the filter clock signal arrives to clock the flip-flop 208. However, in the present situation illustrated in FIGS. 14a–14f, at a second rising edge 224 of filter clock signal (at about 60 nanoseconds in the example of FIGS. 14a–14f), both inputs to AND gate 209 are high. More specifically, the reference signal via delay D2 is high and the UP_NOT signal is high because the first flip-flop 202 was reset at the rising edge 220 of the reference clock signal (at about 50 nanoseconds in the illustrated example). Therefore, the output of the AND gate 209, which is the D input to flip-flop 208, will be high at the arrival of the rising edge 224 of the filter clock signal. This condition will cause the Q output of flip-flop 208 to go high generating the WRONG_DNT pulse illustrated in FIG. 14c. The Q output of the flip-flop 208 is connected to an input of the NOR gate 218. Therefore, the WRONG_DNT pulse will cause the output of the NOR gate 218 to go low, generating a RESET_DN pulse (FIG. 14f) which resets the second flip-flop 204. Therefore, the down pulse 228 generated by the second flip-flop 204 will be reset almost immediately, causing the phase comparator 200 to recover from the cycle slipping situation described above. At the subsequent falling edge 226 of the reference clock signal, the flip-flop 208 will be reset causing the WRONG_DNT signal to go low.

After the generation of the WRONG_DNT pulse when the reference clock signal and the filter clock signal are more than 180 degrees out of phase (i.e., the reference clock signal is missing or delayed for one or more cycles), the phase comparator 200 will behave as described for the case when the reference clock signal leads the filter clock signal (FIGS. 12a–12f).

Referring now to FIGS. 10 and 15a–15f, the operation of the phase comparator 200 of the second embodiment when the filter clock signal (FIG. 15a) leads the reference clock signal (FIG. 15a), but the filter clock signal is missing or delayed for one or more cycles is illustrated. As one skilled in the art will appreciate, this situation is analogous to the situation illustrated in FIGS. 14a–14f. As will become more apparent from the discussion below, the phase comparator 200 recovers from a potential cycle slipping situation indicated by when a first rising edge 230 of the filter clock signal is more than 180 degrees out of phase with a first rising edge 232 of the reference clock signal. The phase comparator 200 uses this recovery operation to avoid generating the result found with the conventional phase comparator 300 illustrated in FIG. 16 and described in more detail above.

Figure 15A:
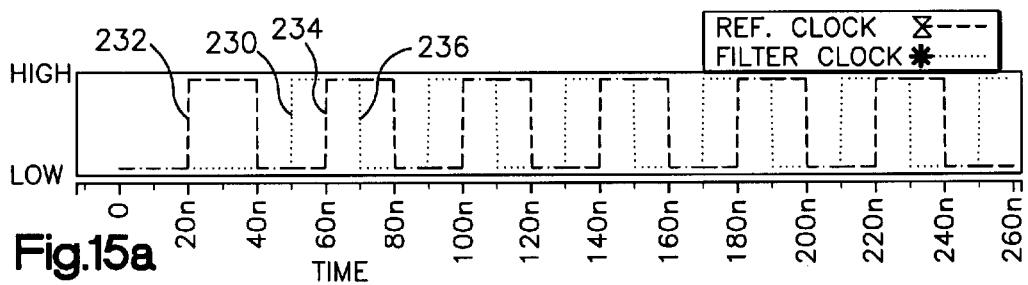
FIGS. 15a–15f are timing diagrams illustrating a fifth example situation for the second embodiment of the phase comparator.
Figure 15B:
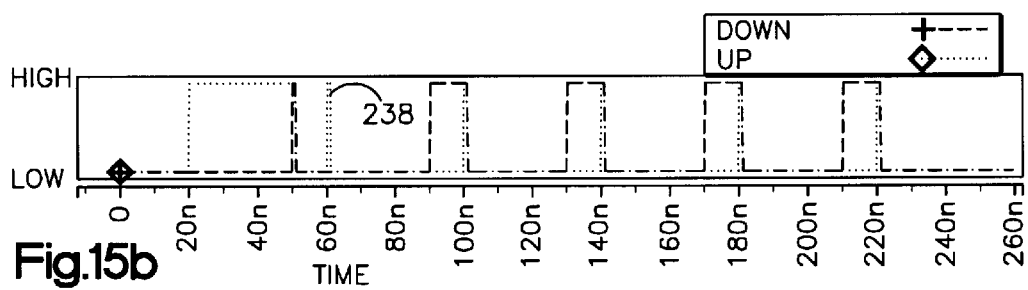
Figure 15C:
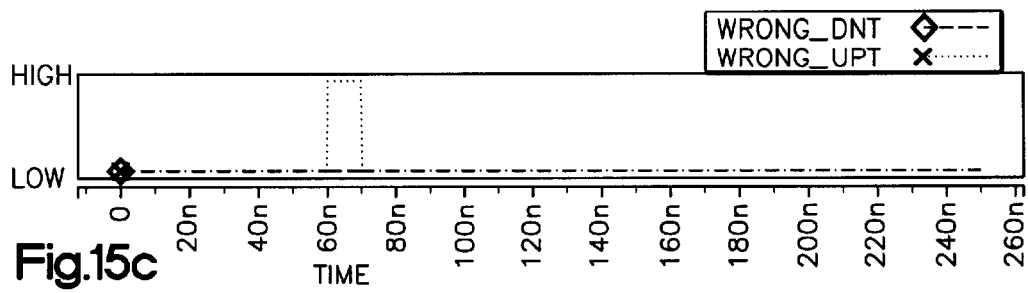
Figure 15D:
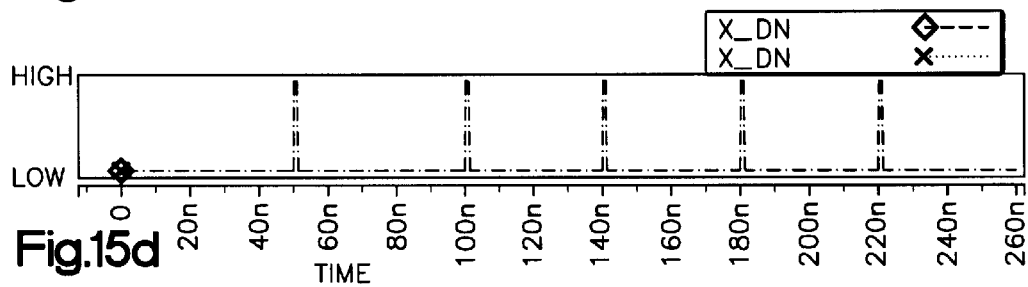
Figure 15E:
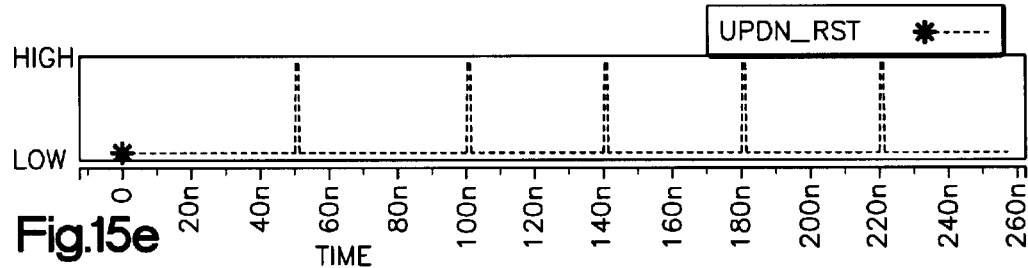
Figure 15F:
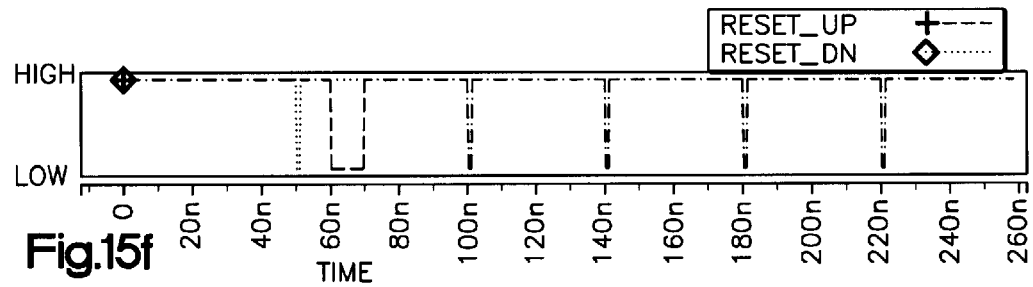

As the first rising edge 232 of the reference clock signal transitions from low to high, the Q output of the first flip-flop 202 will go high and generate an up pulse (FIG. 15b). At this time, the Q outputs of the flip-flops 206, 208, or wrong up true (WRONG_UPT) and wrong down true (WRONG_DNT) respectively (FIG. 15c) will be logical low. These conditions will persist until the first rising edge 230 of the filter clock signal transitions from low to high and the Q output of the second flip-flop 204 will go high and generate a down pulse (FIG. 15b).

The up and down pulses are received at the inputs of the AND gate 210 which generates an up/down reset signal (FIG. 15eUPDN_RST) at its output. Since the up and down pulses are high, the UPDN_RST signal will go high. The UPDN_RST signal is logically anded with a wrong up false (WRONG_UPF) signal (presently high) output from the flip-flop 206 by the AND gate 212 to generate an X_DN signal (FIG. 15d) which will go high in response to the inputs of the AND gate 212. The UPDN_RST signal is also logically anded with a wrong down false (WRONG_DNF) signal (presently high) output from the flip-flop 208 by the AND gate 214 to generate an X_UP signal (FIG. 15d) which will go high in response to the inputs of the AND gate 214.

It is noted that under the conditions illustrated in FIGS. 13a–13b where the filter clock signal leads the reference clock signal, when the filter clock signal goes high the D input to the flip-flop 206 is low. More specifically, the filter clock signal output from the delay D1 is high and DN_NOT is low generating a low output from the AND gate 207 at the time a rising edge of the reference clock signal arrives to clock the flip-flop 206. However, in the present situation illustrated in FIGS. 15a–15f, at a second rising edge 234 of reference clock signal (at about 60 nanoseconds in the example of FIGS. 15a–15f), both inputs to AND gate 207 are high. More specifically, the filter signal via delay D1 is high and the DN_NOT signal is high because the second flip-flop 204 was reset at the rising edge 230 of the filter clock signal (at about 50 nanoseconds in the illustrated example). Therefore, the output of the AND gate 207, which is the D input to flip-flop 206, will be high at the arrival of the rising edge 234 of the reference clock signal. This condition will cause the Q output of flip-flop 206 to go high generating the WRONG_UPT pulse illustrated in FIG. 15c. The Q output of the flip-flop 206 is connected to an input of the NOR gate 216. Therefore, the WRONG_UPT pulse will cause the output of the NOR gate 216 to go low, generating a RESET_UP pulse (FIG. 15f) which resets the first flip-flop 202. Therefore, the up pulse 238 generated by the first flip-flop 202 will be reset almost immediately, causing the phase comparator 200 to recover from the cycle slipping situation described above. At the subsequent falling edge 236 of the filter clock signal, the flip-flop 206 will be reset causing the WRONG_UPT signal to go low.

After the generation of the WRONG_UPT pulse when the filter clock signal and the reference clock signal are more than 180 degrees out of phase (i.e., the filter clock signal is missing or delayed for one or more cycles), the phase comparator 200 will behave as described for the case when the filter clock signal leads the reference clock signal (FIGS. 13a–13f).

It is noted that the situation where the reference clock signal lags the filter clock signal, but the reference clock signal is missing or delayed for one or more cycles, is not generally of concern since the second embodiment of the phase comparator 300 will begin to operate properly on its own (e.g., as illustrated in FIGS. 13a–13f). The same is true for the situation when the filter clock signal lags the reference clock signal, but the filter clock signal is missing or delayed for one or more cycles (e.g., FIGS. 12a12f).

In summary, the phase comparator 200 of the second embodiment address the potential cycle slipping situation of the conventional phase comparator by resetting flip-flop 202, when both of the following conditions are met at the rising edge of the filter clock signal. The first condition is met when one of the delayed filter clock signal is high. The second condition is met when the UP_NOT signal is high. The phase comparator 200 of the second embodiment also addresses the potential cycle slipping situation of the conventional phase comparator by resetting flip-flop 204, when both of the following conditions are met at the rising edge of the reference clock signal. The first condition is met when one of the delayed reference clock signal is high. The second condition is met when the DN_NOT signal is high.

Conclusion

As an alternative to the first and second embodiments of the phase comparator 28, the phase comparator 28 can be implemented with a programmable logic control programmed to recognize and correct the situation where one of the filter clock signal or the reference clock signal leads the other but is delayed or missing for one or more cycles.

As one skilled in the art will appreciate, the first and second embodiments of the phase comparator 28 is not limited to comparing the relative phase difference of a reference signal and a signal derived from a delay filter. The phase comparator can be used to compare the relative phase difference of a reference signal and a monitor signal, such as the feedback signal of a conventional PLL circuit or a signal produced from a delay filter.

Although particular embodiments of the invention have been described in detail, it is understood that the invention is not limited correspondingly in scope, but includes all changes, modifications and equivalents coming within the spirit and terms of the claims appended hereto. Some simple examples of changes that could be made include, but are not limited to, using inverted versions of the signals discussed herein, using falling edge triggered latches, and using alternative logic gates and circuit components.

What is claimed is:

1. A phase comparator comprising:
   a first latch connected to receive a reference signal, the reference signal having a first and a second logical state, and the first latch outputting a first control signal for a correction signal generator, the first control signal having a first and a second logical state;
   a second latch connected to receive a monitor signal, the monitor signal having a first and a second logical state, and the second latch outputting a second control signal for the correction signal generator, the second control signal having a first and a second logical state, the first and second control signals indicative of relative phase of the reference signal and the monitor signal; and
   a reset circuit for resetting the first and second latches when both of the following conditions are met:
   a) a logical OR operation performed by the reset circuit indicates that one of the reference signal is in the first logical state or the first control signal is in the first logical state; and
   b) a logical OR operation performed by the reset circuit indicates that one of the monitor signal is in the first logical state or the second control signal is in the first logical state.

2. The phase comparator according to claim 1, further comprising a 180° phase delay filter for delaying the reference signal, the delayed reference signal being the monitor signal, wherein one of the reference signal or the monitor signal is inverted before being input to the first latch and the second latch respectively.

3. The phase comparator according to claim 2, wherein the 180° phase delay filter is a transconductance filter.

4. The phase comparator according to claim 3, wherein the correction signal generator generates a correction signal based on the relative phase of the reference signal and the monitor signal as indicated by the first and second control signals, the correction signal being fed back to the 180° phase delay filter to adjust the transconductance of the 180° phase delay filter.

5. The phase comparator according to claim 4, wherein the correction signal is fed back to a second transconductance filter for filtering a data signal to adjust the transconductance of the second transconductance filter.

6. A phase comparator for comparing the relative phase of a first input signal and a second input signal, comprising:
   a detecting means for detecting a slipping condition, the slipping condition present if the first input signal leads the second input signal in phase and the first input signal has a first rising edge lagging a first rising edge of the second input signal by greater than 180° and a resetting means for resetting at least one output of the phase comparator upon the detection of the slipping condition.

7. The phase comparator according to claim 6, further comprising:

a first latch connected to receive the first input signal and having an output to output a first control signal for a correction signal generator; and a second latch connected to receive the second input signal and having an output to output a second control signal for a correction signal, the first and second control signals indicative of relative phase of the first and second input signals.

8. The phase comparator according to claim 7, wherein the outputs of both the first and second latch are reset upon the detection of the slipping condition.

9. The phase comparator according to claim 6, wherein the phase comparator has a pair of outputs respectively outputting a first control signal for a correction signal generator and a second control signal for the correction signal generator, the first and second control signals indicative of relative phase of the first and second input signals, at least one output being reset to allow the first and second control signals to periodically indicate relative phase between pulses of the first input signal and pulses of the second input signal, the pulses of the first and second input signals being less than 180° out of phase.

10. The phase comparator according to claim 6, further comprising a 180° phase delay filter for delaying the first input signal to produce the second input signal, and one of the first input signal or the second input signal being inverted before being input to the phase comparator.

11. The phase comparator according to claim 10, wherein the 180° phase delay filter is a transconductance filter.

12. The phase comparator according to claim 6, further comprising:

a 180° phase delay transconductance filter for delaying the first input signal to produce the second input signal, and one of the first input signal or the second input signal being inverted before being input to the phase comparator; and a correction signal generator for generating a correction signal based on the relative phase of the first and second input signal as indicated by the first and second control signals, and the correction signal being fed back to the 180° phase delay transconductance filter to adjust the transconductance of the 180° phase delay transconductance filter.

13. The phase comparator according to claim 12, wherein the correction signal is fed back to a transconductance data filter to adjust the transconductance of the transconductance data filter.

14. The phase comparator according to claim 6, further comprising a 180° phase delay filter for delaying the second input signal to produce the first input signal, and one of the first input signal or the second input signal being inverted before being input to the phase comparator.

15. A phase comparator comprising:

a first latch connected to receive a first input signal, the first input signal having a first and a second logical state, and the first latch outputting a first control signal for a correction signal generator, the first control signal having a first and a second logical state;

a second latch connected to receive a second input signal, the second input signal having a first and a second logical state, and the second latch outputting a second control signal for the correction signal generator, the second control signal having a first and a second logical state, the first and second control signals indicative of relative phase of the first input signal and the second input signal; and a reset circuit for resetting the second latch when both of the following conditions are met at a triggering edge of the second signal:

a) the first input signal is in the first state; and b) the first control signal is in the first state.

16. The phase comparator according to claim 15, wherein the first input signal is delayed for a period of time being at least as long as a propagation delay of the first latch before the determination of whether condition 'a' has been met.

17. The phase comparator according to claim 15, further comprising a 180° phase delay filter for delaying the first input signal, the delayed first input signal being the second input signal, wherein one of the first input signal or the second input signal is inverted before being input to the first latch and the second latch respectively.

18. The phase comparator according to claim 17, wherein the 180° phase delay filter is a transconductance filter.

19. The phase comparator according to claim 18, wherein the correction signal generator generates a correction signal based on the relative phase of the first input signal and the second input signal as indicated by the first and second control signals, and the correction signal being fed back to the 180° phase delay filter to adjust the transconductance of the 180° phase delay filter.

20. The phase comparator according to claim 19, wherein the correction signal is fed back to a second transconductance filter for filtering a data signal to adjust the transconductance of the second transconductance filter.

21. The phase comparator according to claim 15, further comprising a 180° phase delay filter for delaying the second input signal to produce the first input signal, wherein one of the first input signal or the second input signal is inverted before being input to the first latch and the second latch respectively.

22. A transconductance compensation circuit for adjusting the transconductance of a data filter, comprising:

a signal generator for generating a reference signal;

a proxy filter for delaying the reference signal to produce a filter signal;

a phase comparator for comparing the relative phase of the reference signal and the filter signal, the phase comparator generating a first and second control signal indicative of the relative phase of the reference and filter signals, the phase comparator resetting at least one of the first or second control signals when at least one of the following conditions are met:

a) the reference signal leads the filter signal in phase and the reference signal has a first rising edge lagging a first rising edge of the filter signal by greater than 180°; or b) the filter signal leads the reference signal in phase and the filter signal has a first rising edge lagging a first rising edge of the reference signal by greater than 180°; and a correction signal generator for generating a correction signal based on the relative phase of the reference and filter signals as indicated by the first and second control signals, wherein the correction signal is fed back to the proxy filter and the data filter to adjust the transconductance of the proxy filter and the data filter.

23. The transconductance compensation circuit according to claim 22, wherein the phase comparator includes:
   a first latch connected to receive the reference signal, the reference signal having a first and a second logical state, and the first latch outputting the first control signal, the first control signal having a first and a second logical state;
   a second latch connected to receive the filter signal, the filter signal having a first and a second logical state, and the second latch outputting the second control signal, the second control signal having a first and a second logical state; and
   a reset circuit for resetting the first and second latches when both of the following conditions are met:
      a) when one of the reference signal is in the first logical state or the first control signal is in the first logical state; and
      b) when one of the filter signal is in the first logical state or the second control signal is in the first logical state.

24. The transconductance compensation circuit according to claim 22, wherein the proxy filter is a 180° phase delay transconductance filter, and one of the reference signal or the filter signal is inverted before being input to the phase comparator.

25. The transconductance compensation circuit according to claim 22, wherein the phase comparator includes:
   a first latch connected to receive the reference signal, the reference signal having a first and a second logical state, and the first latch outputting the first control signal, the first control signal having a first and a second logical state;
   a second latch connected to receive the filter signal, the filter signal having a first and a second logical state, and the second latch outputting a second control signal, the first control signal having a first and a second logical state; and
   a reset circuit for resetting the second latch when both of the following conditions are met at a triggering edge of the filter signal:
      a) the reference signal is in the first state; and
      b) the first control signal is in the first state.

26. The transconductance compensation circuit according to claim 25, wherein the reference signal is delayed for a period of time being at least as long as a propagation delay of the first latch before the determination of whether condition 'a' has been met.

27. The transconductance compensation circuit according to claim 22, wherein the phase comparator includes:
   a first latch connected to receive the reference signal, the reference signal having a first and a second logical state, and the first latch outputting the first control signal, the first control signal having a first and a second logical state;
   a second latch connected to receive the filter signal, the filter signal having a first and a second logical state, and the second latch outputting a second control signal, the second control signal having a first and a second logical state; and
   a reset circuit for resetting the first latch when both of the following conditions are met at a triggering edge of the reference signal:
      a) the filter signal is in the first state; and
      b) the second control signal is in the first state.

28. The transconductance compensation circuit according to claim 25, wherein the filter signal is delayed for a period of time being at least as long as a propagation delay of the first latch before the determination of whether condition 'a' has been met.

29. The transconductance compensation circuit according to claim 22, wherein the signal generator is a sine wave generator.

30. The transconductance compensation circuit according to claim 29, further comprising:
   a reference sine to square wave converter for converting the reference signal to a square wave before the reference signal is input to the phase comparator; and
   a filter sine to square wave converter for converting the filter signal to a square wave before the filter signal is input to the phase comparator.

31. A method of comparing the phase of a reference signal, the reference signal having a first and a second logical state, and a monitor signal, the monitor signal having a first and a second logical state, comprising the steps of:
   receiving the reference signal by a first latch and outputting a first control signal for a correction signal generator from the first latch, the first control signal having a first and a second logical state;
   receiving the monitor signal by a second latch and outputting a second control signal for the correction signal generator from the second latch, the second control signal having a first and a second logical state, the first and second control signals indicative of relative phase of the reference signal and the monitor signal; and
   resetting the first and second latches when both of the following conditions are met:
      a) logically ORing the reference signal and the first control signal indicates that one of the reference signal is in the first logical state or the first control signal is in the first logical state; and
      b) logically ORing the monitor signal and the second control signal indicates that one of the monitor signal is in the first logical state or the second control signal is in the first logical state.

32. The method according to claim 31, further comprising the steps of:
   delaying the reference signal by 180° with a 180° phase delay filter, the delayed reference signal being the monitor signal; and
   inverting one of the reference signal or the monitor signal being received by the first latch and the second latch respectively.

33. The method according to claim 32, further comprising the steps of:
   generating a correction signal based on the relative phase of the reference signal and the monitor signal as indicated by the first and second control signals; and
   feeding the correction signal back to the 180° phase delay filter to adjust a transconductance of the 180° phase delay filter.

34. The method according to claim 33, further comprising the step of feeding the correction signal back to a data filter to adjust a transconductance of the data filter.

35. A method of comparing the relative phase of a first input signal and a second input signal, comprising the steps of:
   generating a first control signal and a second control signal, the first and second control signals indicative of relative phase of the first and second input signals;

detecting a slipping condition, the slipping condition present if the first input signal leads the second input signal in phase and the first input signal has a first rising edge lagging a first rising edge of the second input signal by greater than 180°; and resetting at least one of the first or second control signals upon the detection of the slipping condition.

36. The method according to claim 35, wherein both the first and second control signals are reset upon the detection of the slipping condition.

37. The method according to claim 35, wherein after the at least one of the first or second control signals is reset, the first and second control signals periodically indicate relative phase between pulses of the first input signal and pulses of the second input signal, the pulses of the first and second input signals being less than 180° out of phase.

38. The method according to claim 35, further comprising the steps of:

delaying the first input signal by 180° degrees with a transconductance filter to produce the second input signal; and inverting one of the first input signal or the second input signal.

39. The method according to claim 38, further comprising the steps of:

generating a correction signal based on the relative phase of the first and second input signal as indicated by the first and second control signals; and feeding the correction signal back to the 180° phase delay transconductance filter to adjust the transconductance of the 180° phase delay transconductance filter.

40. The method according to claim 39, further comprising the step of feeding the correction signal back to a transconductance data filter to adjust the transconductance of the transconductance data filter.

41. The method according to claim 35, further comprising the steps of:

delaying the second input signal to produce the first input signal with a 180° phase delay transconductance filter; and inverting one of the first input signal or the second input signal.

42. A method of comparing the relative phase of a first input signal, the first input signal having a first and a second logical state, and a second input signal, the second input signal having a first and a second logical state, comprising the steps of:

receiving the first input signal by a first latch and outputting a first control signal for a correction signal generator from the first latch, the first control signal having a first and a second logical state;

receiving the second input signal by a second latch and outputting a second control signal for the correction signal generator from the second latch, the second control signal having a first and a second logical state, the first and second control signals indicative of relative phase of the first input signal and the second input signal; and resetting the second latch when both of the following conditions are met at a triggering edge of the second signal:

a) the first input signal is in the first state; and b) the first control signal is in the first state.

43. The method according to claim 42, further comprising the step of delaying the first input signal for a period of time being at least as long as a propagation delay of the first latch before the determination of whether condition 'a' has been met.

44. The method according to claim 43, further comprising the steps of:

delaying the first input signal with a 180° phase delay transconductance filter, the delayed first input signal being the second input signal; and inverting one of the first input signal or the second input signal.

45. The method according to claim 44; further comprising the steps of:

generating a correction signal based on the relative phase of the first input signal and the second input signal as indicated by the first and second control signals; and feeding the correction signal back to the 180° phase delay transconductance filter to adjust the transconductance of the 180° phase delay transconductance filter.

46. The method according to claim 45, further comprising the step of feeding the correction signal back to a transconductance data filter to adjust the transconductance of the transconductance data filter.

47. The method according to claim 42, further comprising the steps of:

delaying the second input signal with a 180° phase delay transconductance filter, the delayed second input signal being the first input signal; and inverting one of the first input signal or the second input signal.

48. A method of adjusting transconductance of a data filter, comprising the steps of:

generating a reference signal;

delaying the reference signal with a proxy filter to produce a filter signal;

comparing the relative phase of the reference signal and the filter signal;

generating a first and second control signal indicative of the relative phase of the reference and filter signals;

resetting at least one of the first or second control signals when at least one of the following conditions are met:

a) the reference signal leads the filter signal in phase and the reference signal has a first rising edge lagging a first rising edge of the filter signal by greater than 180°; or b) the filter signal leads the reference signal in phase and the filter signal has a first rising edge lagging a first rising edge of the reference signal by greater than 180°;

generating a correction signal based on the relative phase of the reference and filter signals as indicated by the first and second control signals; and feeding the correction signal back to the proxy filter and the data filter to adjust the transconductance of the proxy filter and the data filter.

49. The method according to claim 48, wherein the reference signal has a first and a second logical state, the filter signal has a first and a second logical state, the first control signal has a first and a second logical state, the second control signal has a first and a second logical state, and the first and second control signals are reset when both of the following conditions are met:

a) when one of the reference signal is in the first logical state or the first control signal is in the first logical state; and b) when one of the filter signal is in the first logical state or the second control signal is in the first logical state.

50. The method according to claim 48, wherein the proxy filter is a 180° phase delay transconductance filter, and one of the reference signal or the filter signal is inverted.

51. The method according to claim 48, wherein the reference signal has a first and a second logical state, the filter signal has a first and a second logical state, the first control signal has a first and a second logical stage, the second control signal has a first and a second logical state, and the second control signal is reset when both of the following conditions are met at a triggering edge of the filter signal:

a) the reference signal is in the first state; and b) the first control signal is in the first state.

52. The method according to claim 51, further comprising the step of delaying the reference signal for a period of time being at least as long as a propagation delay for producing the first control signal before the determination of whether the reference signal is in the first state.

53. The method according to claim 47, wherein the reference signal has a first and a second logical state, the filter signal has a first and a second logical state, the first control signal has a first and a second logical state, the second control signal has a first and a second logical state, and the first control signal is reset when both of the following conditions are met at a triggering edge of the reference signal:

a) the filter signal is in the first state; and b) the second control signal is in the first state.

54. The method according to claim 53, further comprising the step of delaying the filter signal for a period of time being at least as long as a propagation delay for producing the second control signal before the determination of whether the filter signal is in the first state.

55. The method according to claim 48, wherein the generated reference signal is a sine wave.

56. The method according to claim 55, further comprising the step of converting the reference signal and the filter signal to square waves before comparing the relative phases of the reference signal and the filter signal.

* * * * *